United States Patent
Shvartsman et al.

(10) Patent No.: US 7,276,906 B2
(45) Date of Patent: Oct. 2, 2007

(54) SELF-SHIELDED GRADIENT FIELD COIL FOR MAGNETIC RESONANCE IMAGING

(75) Inventors: Shmaryu M. Shvartsman, Highland Hts., OH (US); Michael A. Morich, Mentor, OH (US); Gordon D. DeMeester, Wickliffe, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 36 days.

(21) Appl. No.: 10/535,530

(22) PCT Filed: Oct. 29, 2003

(86) PCT No.: PCT/IB03/04802

§ 371 (c)(1),
(2), (4) Date: May 18, 2005

(87) PCT Pub. No.: WO2004/046745

PCT Pub. Date: Jun. 3, 2004

(65) Prior Publication Data

US 2006/0033496 A1    Feb. 16, 2006

Related U.S. Application Data

(60) Provisional application No. 60/427,969, filed on Nov. 20, 2002.

(51) Int. Cl.
*G01V 3/00* (2006.01)
(52) U.S. Cl. ............................. 324/318; 324/322
(58) Field of Classification Search ........... 324/318, 324/322
See application file for complete search history.

(56) References Cited

U.S. PATENT DOCUMENTS

| 4,794,338 A | 12/1988 | Roemer et al. ............. 324/39 |
| 4,978,920 A | 12/1990 | Mansfield et al. ........ 324/318 |

(Continued)

FOREIGN PATENT DOCUMENTS

EP    0 562 707 A1    9/1993

(Continued)

OTHER PUBLICATIONS

Kimmlingen, et al., AGradient System Providing Continuously Variable Field Characteristics@, Magnetic Resonance in Medicine 47: 800-808 (2002).

(Continued)

*Primary Examiner*—Louis M. Arana

(57) ABSTRACT

A gradient coil for a magnetic resonance imaging apparatus (10) includes a primary coil (16) defining an inner cylindrical surface (60), and shield coil (18) or coils defining a coaxial outer cylindrical surface (62). Coil jumps (74) connect the primary and shield coils (16, 18). The coil jumps (74) define a non-planar current-sharing surface (64) extending between inner and outer contours (66, 68) that coincide with the inner and outer cylindrical surfaces (60, 62), respectively. The coil (16, 18, 74) defines a current path that passes across the current sharing surface (64) between the inner and outer contours (66, 68) a plurality of times. Optionally, some primary coil turns (70) are electrically interconnected to define an isolated primary sub coil (P2) that together with a second shield (S2, S2', S2") enables a discretely or continuously selectable field of view.

20 Claims, 27 Drawing Sheets

U.S. PATENT DOCUMENTS

| | | | |
|---|---|---|---|
| 5,296,810 A | 3/1994 | Morich | 324/318 |
| 5,349,296 A | 9/1994 | Cikotte et al. | |
| 5,349,318 A | 9/1994 | Inoue | |
| 5,406,205 A | 4/1995 | Muller | |
| 5,512,828 A * | 4/1996 | Pausch et al. | 324/309 |
| 5,561,371 A | 10/1996 | Schenck | 324/318 |
| 5,736,858 A | 4/1998 | Katznelson et al. | 324/318 |
| 6,049,207 A | 4/2000 | Petropoulos | 324/318 |
| 6,078,177 A | 6/2000 | Petropoulos et al. | 324/318 |
| 6,236,203 B1 | 5/2001 | Shvartsman et al. | 324/309 |
| 6,278,275 B1 * | 8/2001 | Petropoulos et al. | 324/318 |
| 6,297,635 B1 | 10/2001 | Arz et al. | 324/318 |
| 6,342,787 B1 | 1/2002 | Petropoulos et al. | 324/320 |
| 6,479,999 B1 | 11/2002 | DeMeester et al. | 324/318 |
| 6,538,443 B2 | 3/2003 | Morich et al. | |
| 6,717,409 B2 * | 4/2004 | Kimmlingen et al. | 324/318 |

FOREIGN PATENT DOCUMENTS

| | | |
|---|---|---|
| EP | 1 094 330 A2 | 4/2001 |
| EP | 1 102 080 A2 | 5/2001 |
| GB | 2 331 808 A | 6/1999 |
| WO | WO 93/04493 | 3/1993 |

OTHER PUBLICATIONS

Kimmlingen, et al. AGradient System with Continuously Variable Field Characteristics@, ISMRM 2000.

DeMeester, G., et al.; Shielded Gradient Coil Design with Variable Field-of-View; 2002; Proc. Intl. Soc. Mag. Reson. Med.; 10: abstract.

DeMeester, G., et al.; Method of Gradient Coil Design that Allows Control of the Residual Eddy Current Effect; 2003; Proc. Intl. Soc. Mag. Reson. Med: 11: 2416.

Shvartsman, S., et al.; Gradient Coil Design with 3D Geometry and Variable Field-of-View; 2003; Proc. Intl. Soc. Mag. Reson. Med.; 11:743.

* cited by examiner

SELF-SHIELDED GRADIENT FIELD COIL FOR MAGNETIC RESONANCE IMAGING

CROSS REFERENCE TO RELATED APPLICATION

This application claims the benefit of U.S. provisional application Ser. No. 60/427,969 filed Nov. 20, 2002, which is incorporated herein by reference.

The following relates to the diagnostic imaging arts. It particularly relates to magnetic field gradient coils for use in short-bore magnetic resonance imaging scanners, and will be described with particular reference thereto. However, the following relates more generally to magnetic field gradient coils for various types of magnetic resonance imaging scanners, and to dedicated gradient coils for imaging reduced volumes of interest.

In a magnetic resonance imaging system, spatial encoding of the magnetic resonances is typically accomplished by generating magnetic field gradients in an imaging region. These gradients are produced by a set of magnetic field gradient coils. Gradient coils are typically provided for producing independent magnetic field gradients in each of the transverse x- and y-directions, and in the axial z-direction.

For various applications, such as producing gradients in short-bore magnetic resonance imaging scanners, or producing dedicated localized gradients over a reduced field of view (FoV) for imaging specific organs, it is desirable to employ relatively shorter gradient coils. In scaling gradient coils to reduced length while retaining high gradient peak amplitudes and linearity and bore diameter, coil turns become increasingly compressed near the coil extremities. Moreover, imaging distortions and artifacts due to eddy currents induced in a surrounding cold shield become more problematic. Furthermore, adaptive or variable field of view gradient coils are desired to adapt a given magnetic resonance scanner or magnetic field gradient coil set for a wider range of applications.

The present invention contemplates an improved apparatus and method that overcomes the aforementioned limitations and others.

According to one aspect, a gradient coil is disclosed for a magnetic resonance imaging apparatus. A primary coil defines an inner cylindrical surface. A shield coil defines an outer cylindrical surface coaxially aligned with the inner cylindrical surface and having a larger cylindrical radius than the inner cylindrical surface. A plurality of coil jumps electrically connect the primary and shield coils. The coil jumps define a non-planar current-sharing surface extending between an inner contour coinciding with the inner cylindrical surface and an outer contour coinciding with the outer cylindrical surface. The primary coil, shield coil, and coil jumps cooperatively define a current path that passes across the current-sharing surface between the inner and outer contours a plurality of times.

According to another aspect, a method is provided for producing a magnetic field gradient in a magnet bore of a magnetic resonance imaging apparatus. An electrical current is circulated through a primary coil that defines an inner cylindrical surface. The electrical current is circulated through a shield coil that defines an outer cylindrical surface coaxially aligned with the inner cylindrical surface and having a larger cylindrical radius than the inner cylindrical surface. The electrical current is communicated between the primary and shield coils via a plurality of non-planar coil jumps a plurality of times.

According to yet another aspect, a method is provided for designing a gradient coil for a magnetic resonance imaging apparatus. Current densities are computed on coaxial inner and outer cylindrical surfaces using constraints on the stored energy and gradient field linearity and uniformity. The computed current densities are generally non-zero at non-coplanar boundary contours that define coil edges. Primary coil turns, shield coil turns, and coil jumps are selected to approximate the computed current densities on the inner and outer cylindrical surfaces.

One advantage of designing the gradient coil with shared turns on the primary and shield coil is that it allows shorter shielded gradient coil designs.

Another advantage resides in reduced magnetic field gradient distortion due to eddy currents in the cold shield or other conductive elements of the magnetic resonance imaging scanner.

Another advantage resides in reduced current winding densities at the extremities of the gradient coil.

Yet another advantage resides in reduced $I^2R$ heating, particularly in regions of high winding density.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 2:
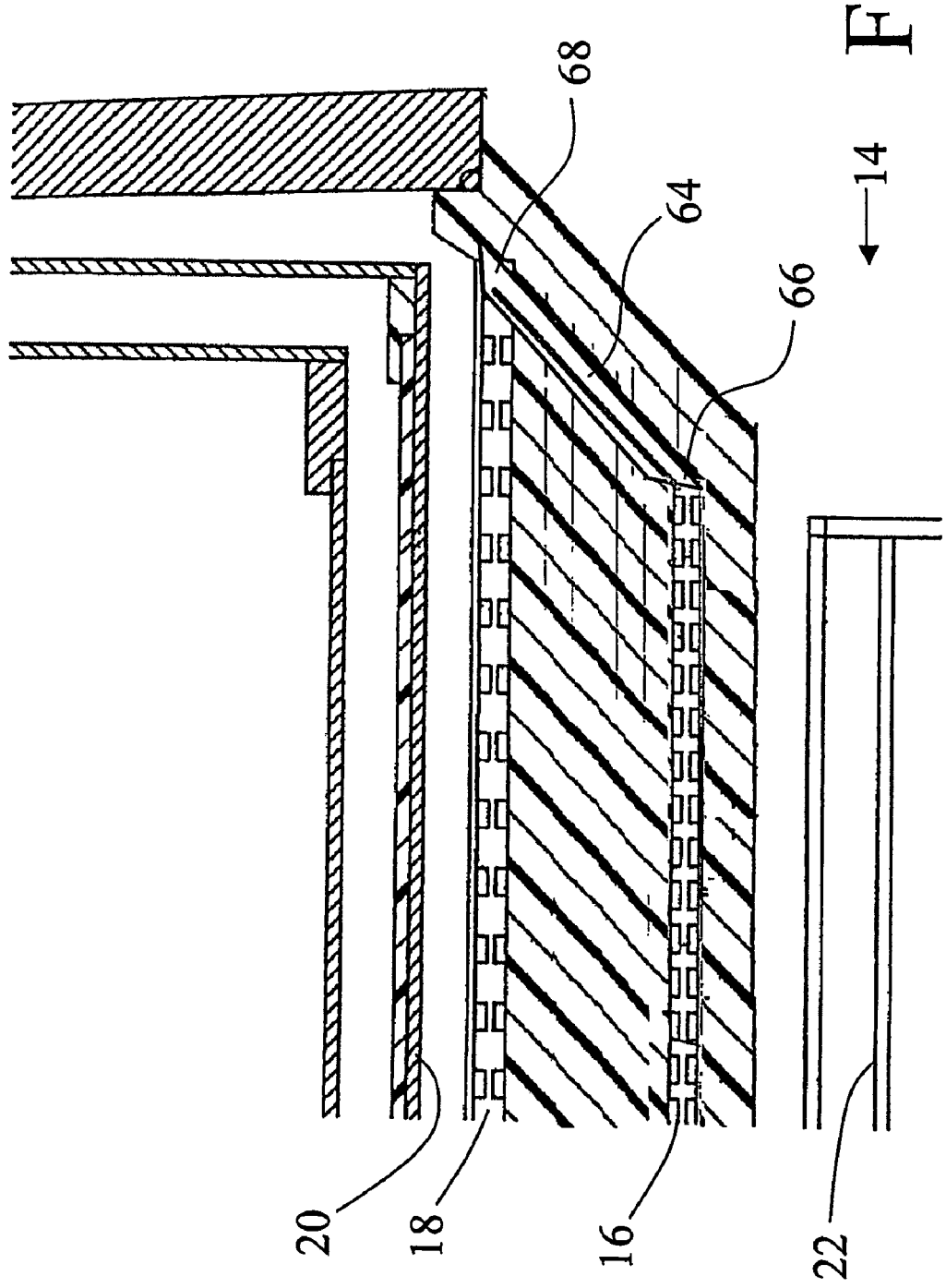
FIG. 2 shows an enlarged cross-sectional view of the magnetic resonance imaging apparatus which shows a flared arrangement of primary and shield gradient coils and a current-sharing surface for passing current back and forth between the primary and shield gradient coils.
Figure 3:
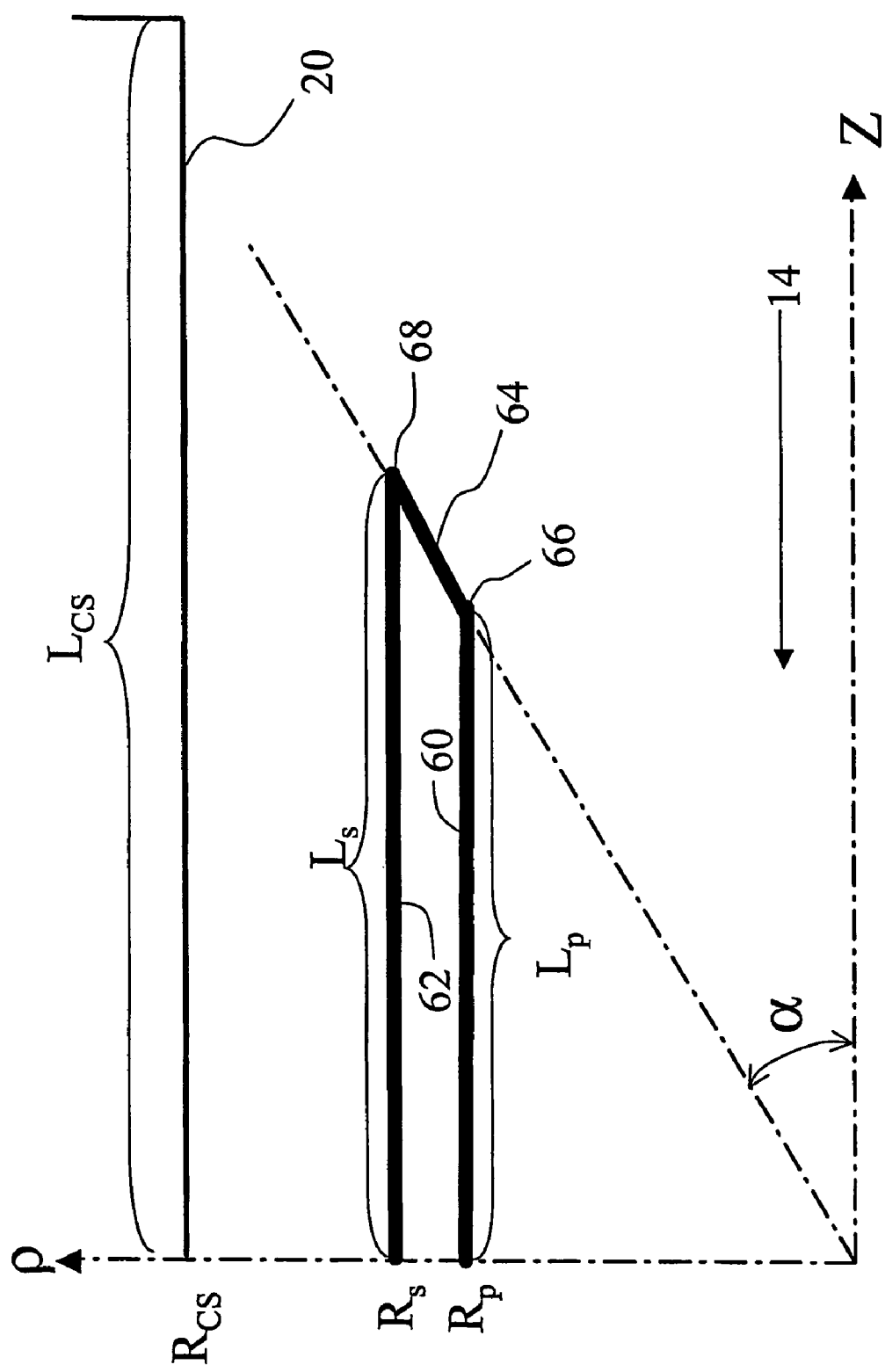

FIG. 3 diagrammatically shows a sectional view of the geometrical arrangement of the primary and shield gradient coils of FIG. 2, with a suitable dimensional nomenclature superimposed.

Figure 4:
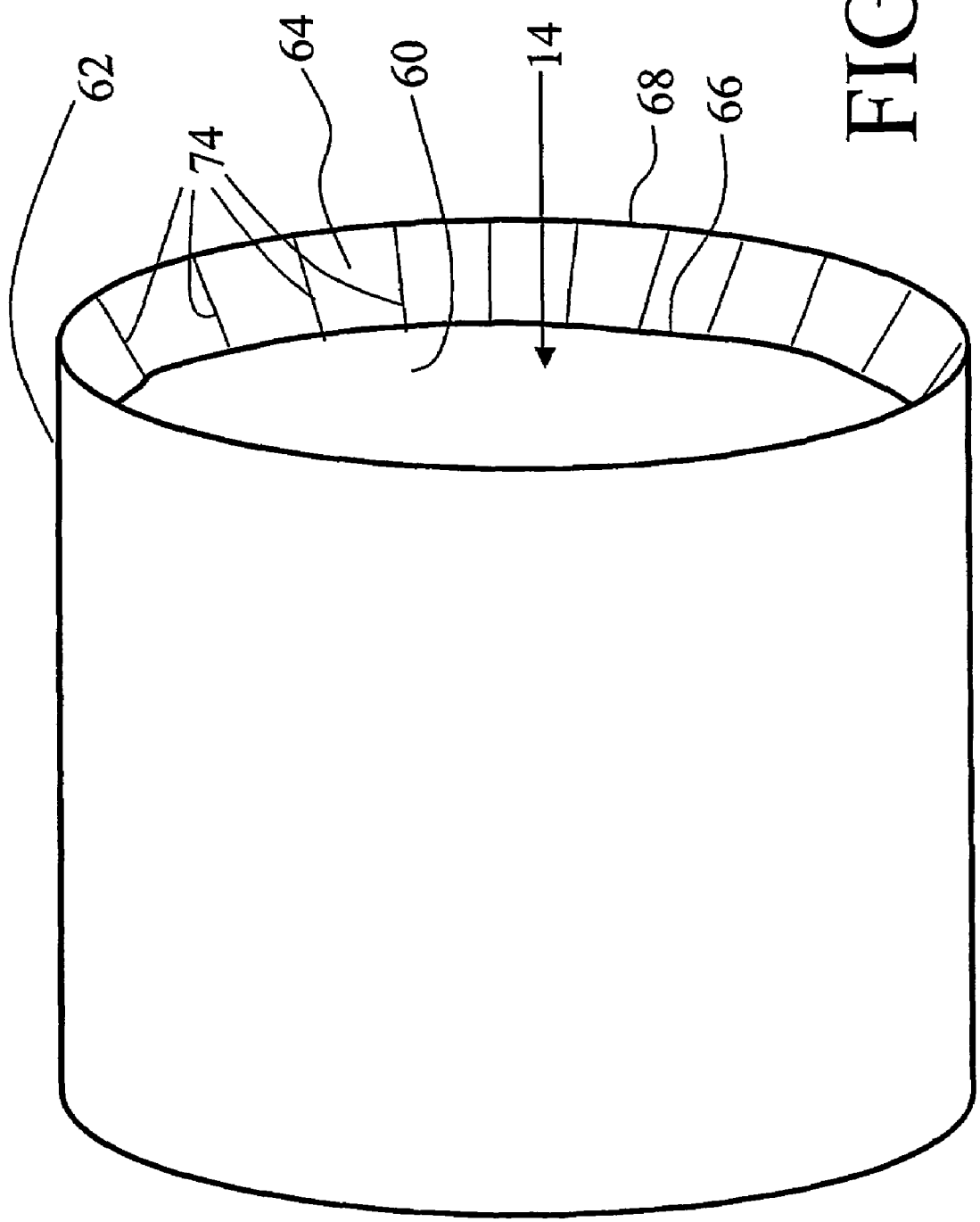

FIG. 4 diagrammatically shows a perspective view of the geometrical arrangement of the primary and shield gradient coils.

Figure 5:
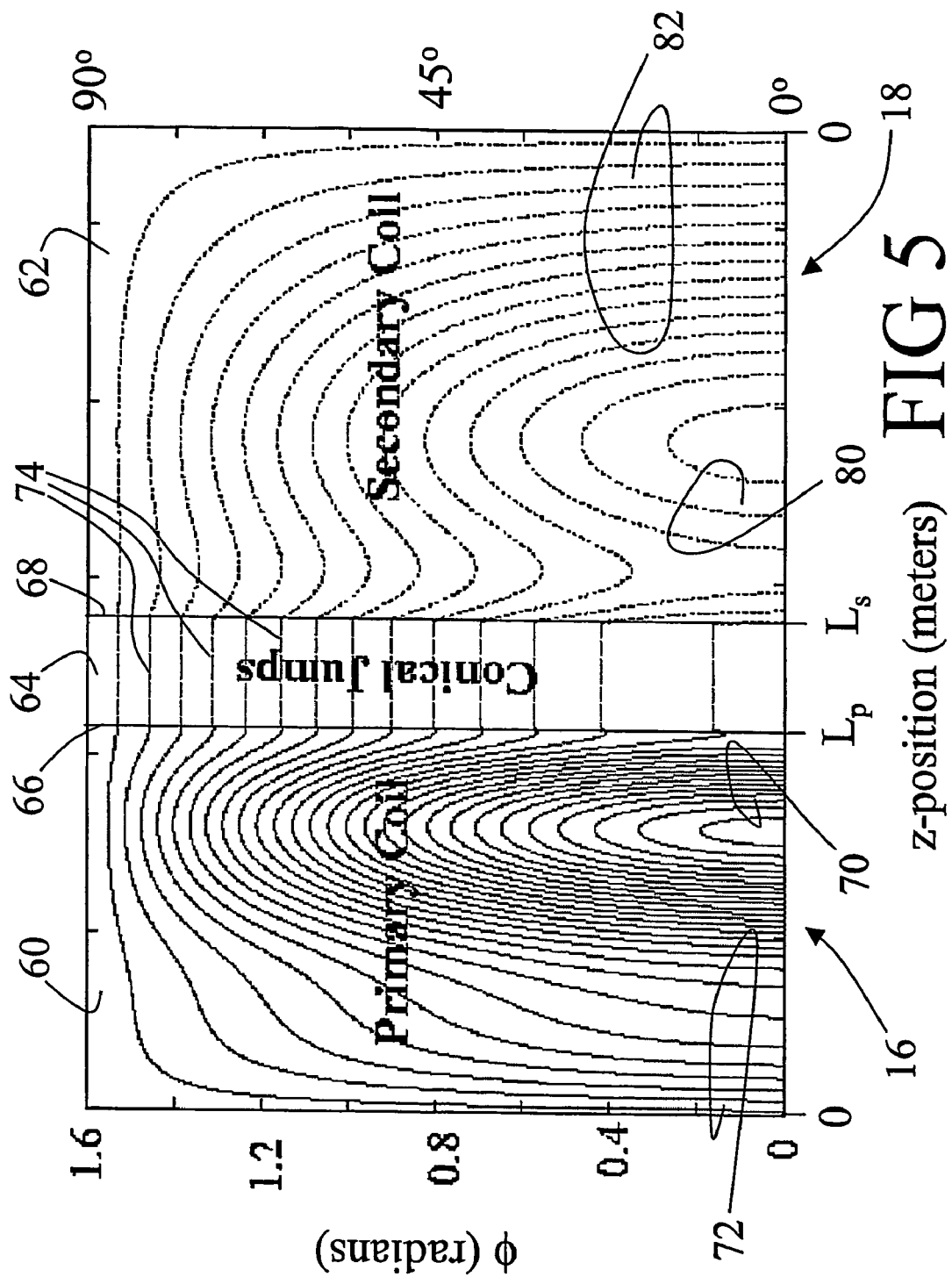

FIG. 5 shows an unfolded half-quadrant layout of the X-gradient primary and shield gradient coils and the interconnecting coil jumps.

Figure 6:
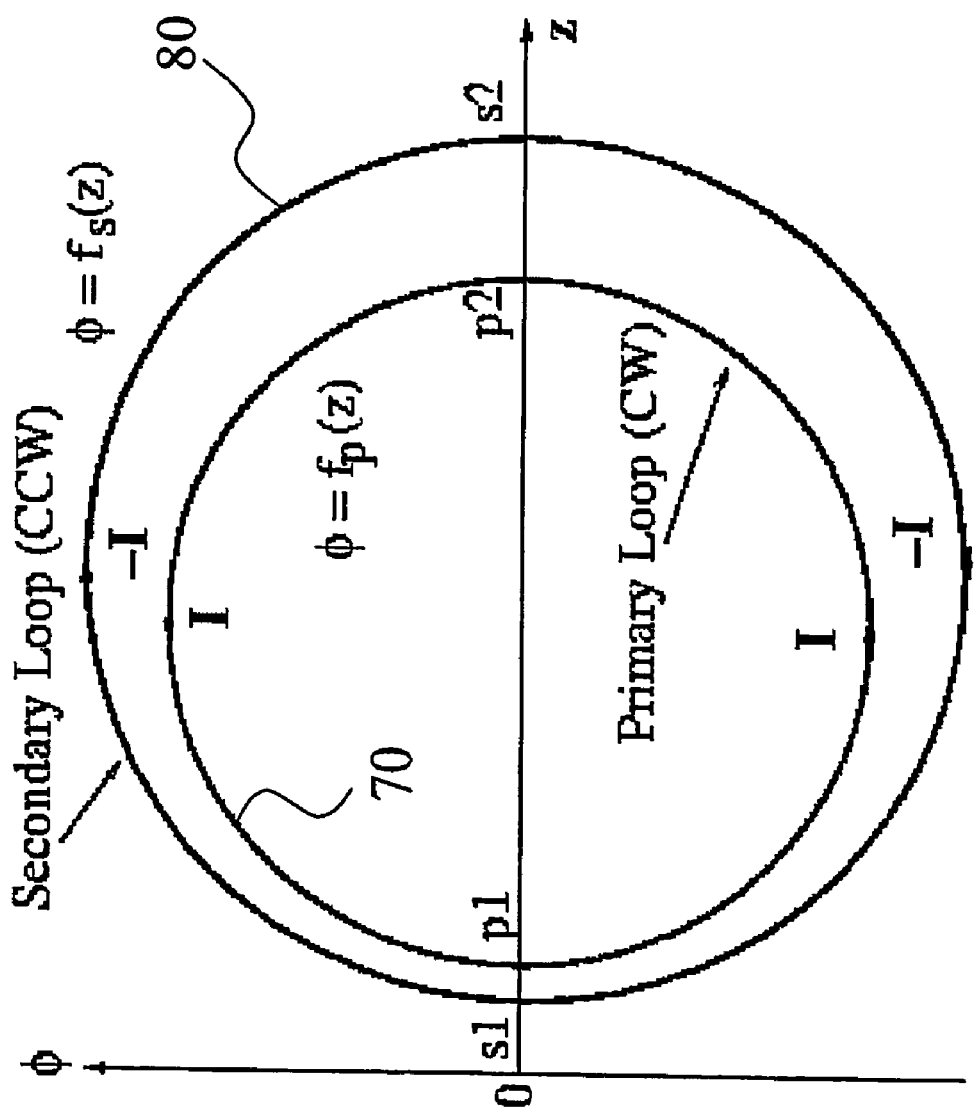

FIG. 6 shows exemplary isolated primary and shield coil turns of the X-gradient coil of FIG. 5.

Figure 7:
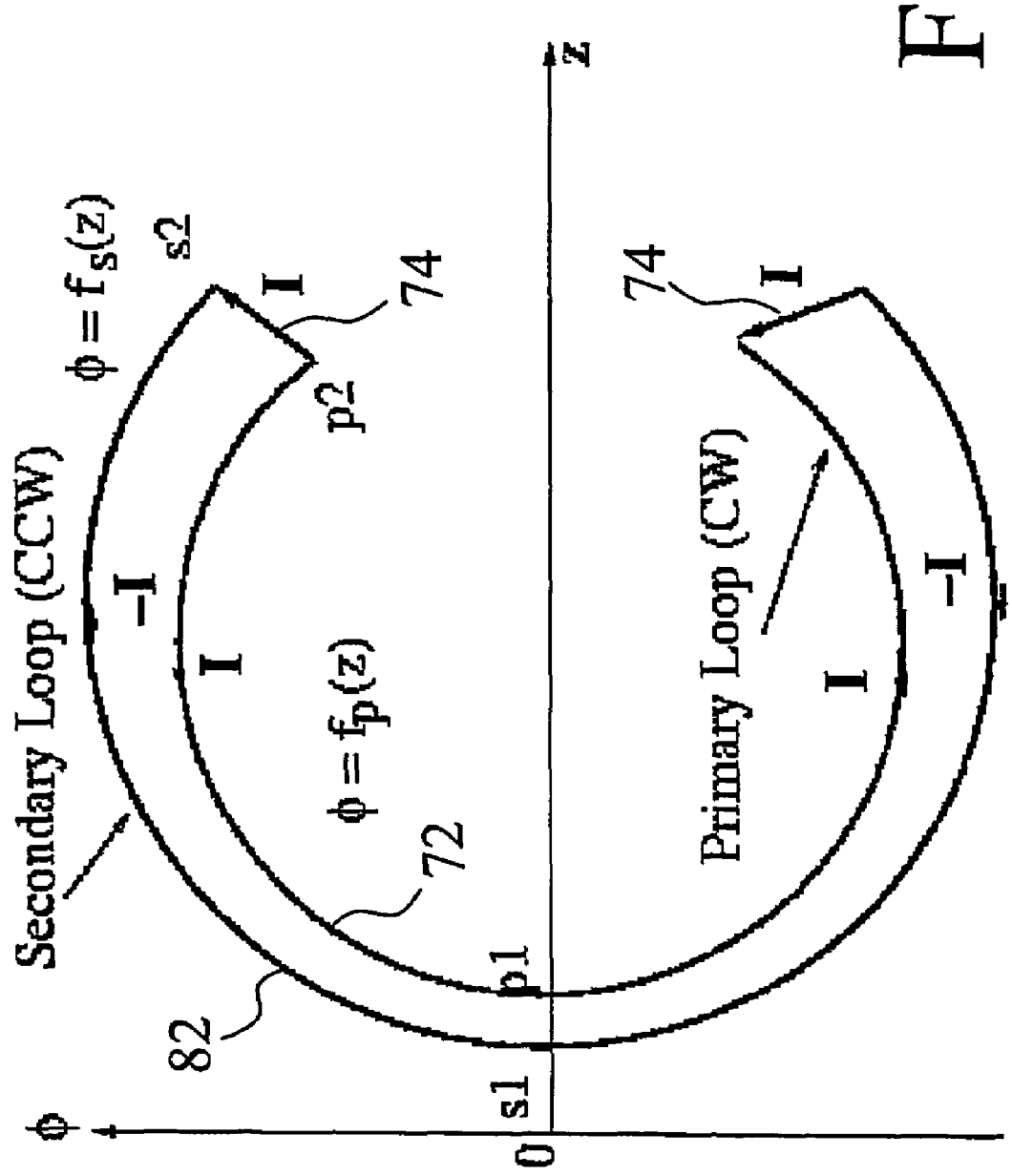

FIG. 7 shows exemplary communicating primary and shield coil turns of the X-gradient coil of FIG. 5.

Figure 8A:
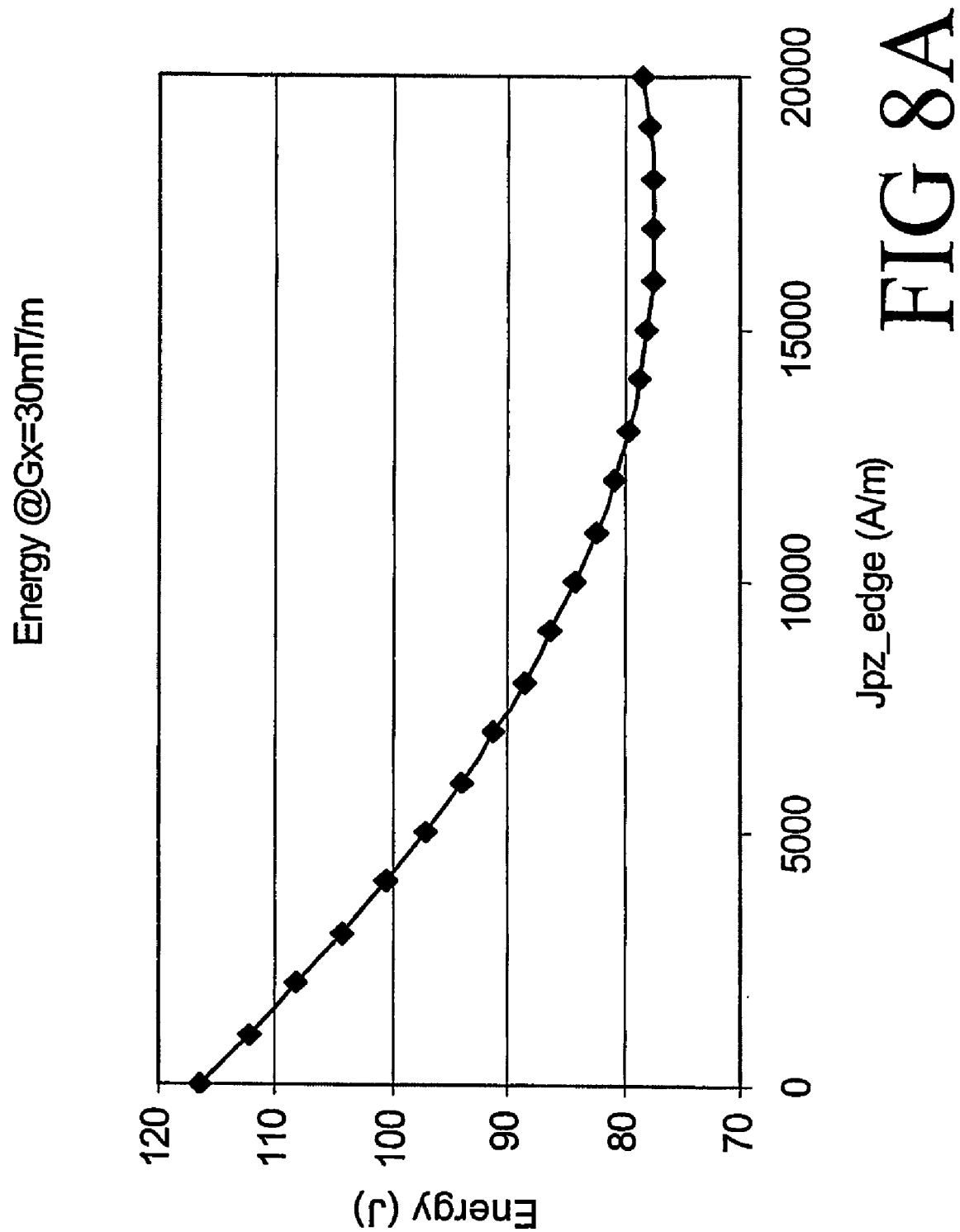

FIG. 8A shows a plot of gradient coil system energy versus the z-component of the current density at the edge of the primary coil for an exemplary transverse gradient coil design which has $G_x$=30 mT/m and the eddy current effect is −0.22%.

Figure 8B:
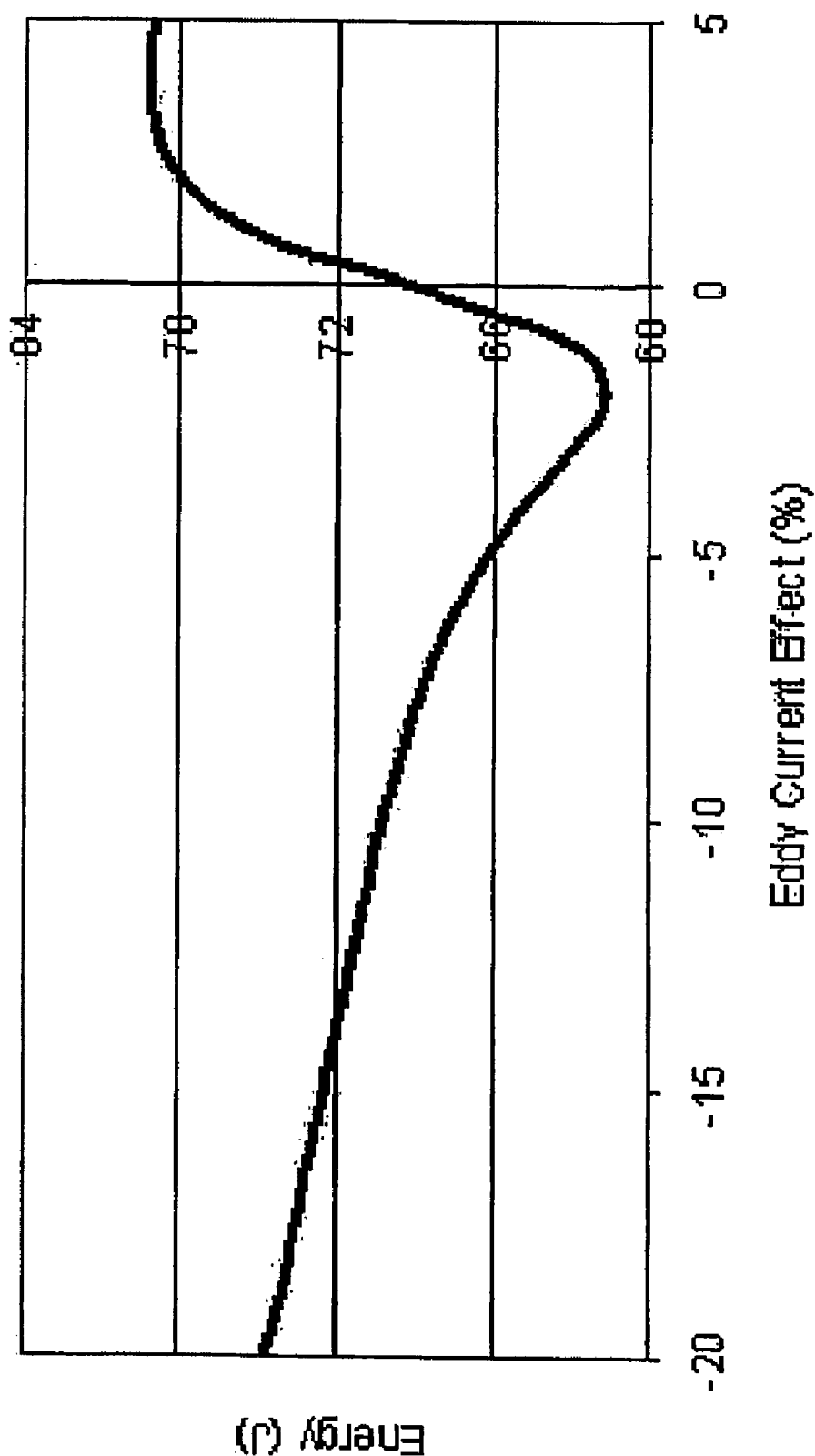

FIG. 8B shows a plot of gradient coil system energy versus residual eddy current effect for an exemplary transverse gradient coil design which has $G_x$=30 mT/m and $J_{zp, \, edge}$=17 kA/m.

Figure 9:
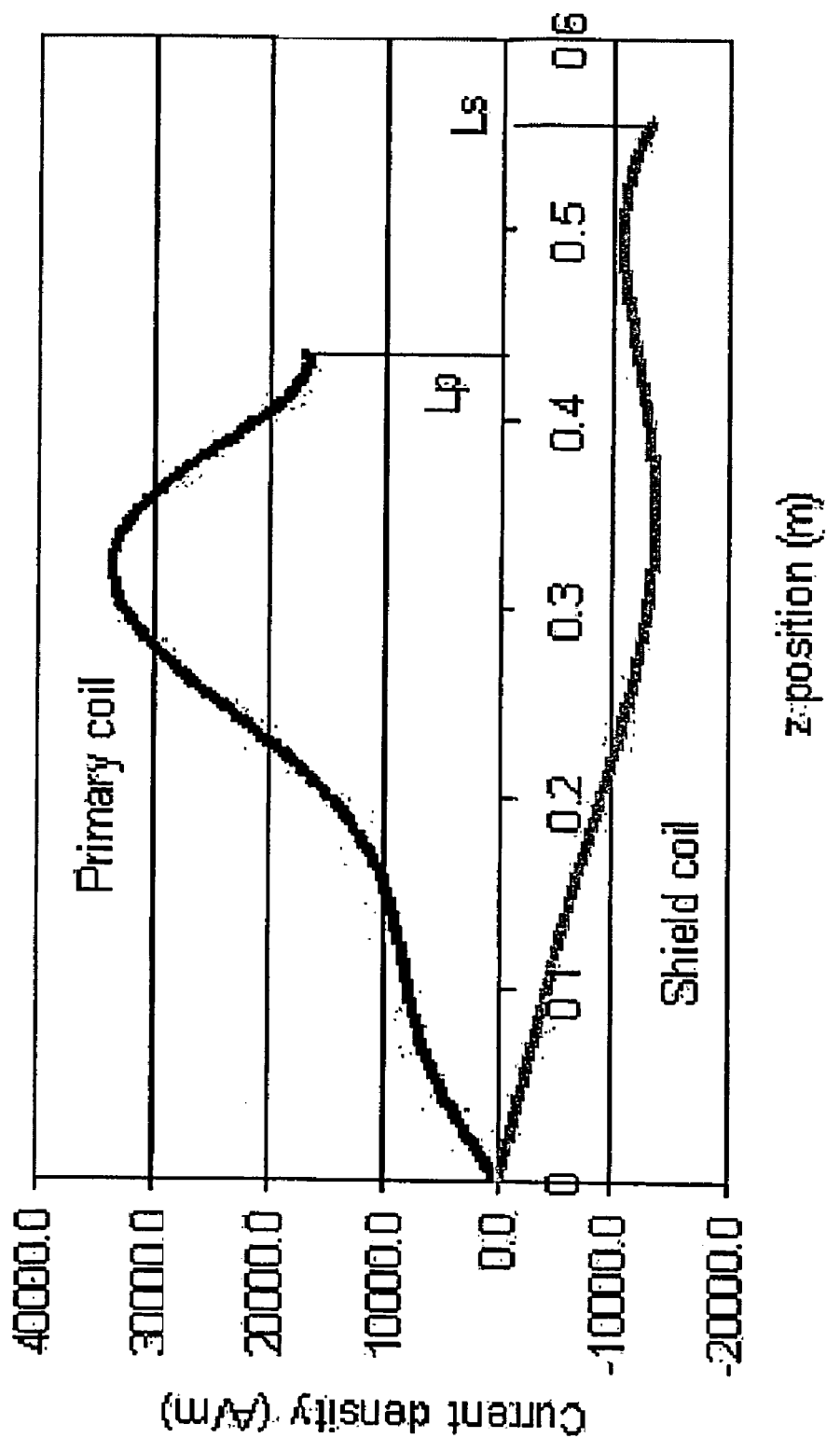

FIG. 9 shows a plot of the z-component of the current density for the primary and shield coils layout shown in FIG. 5.

Figure 10:
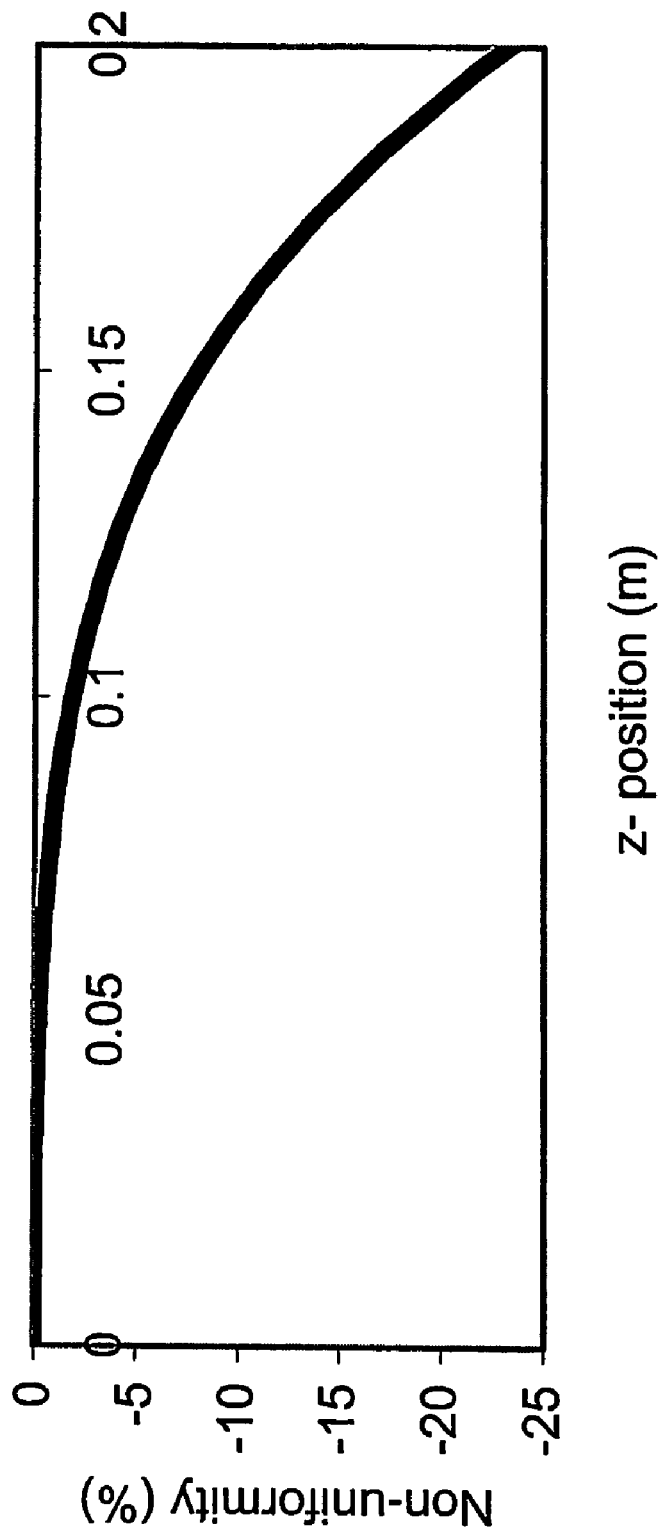

FIG. 10 shows a plot of X-gradient non-uniformity at a radius of 0.001 meters for the primary and shield coils layout shown in FIG. 5.

Figure 11:
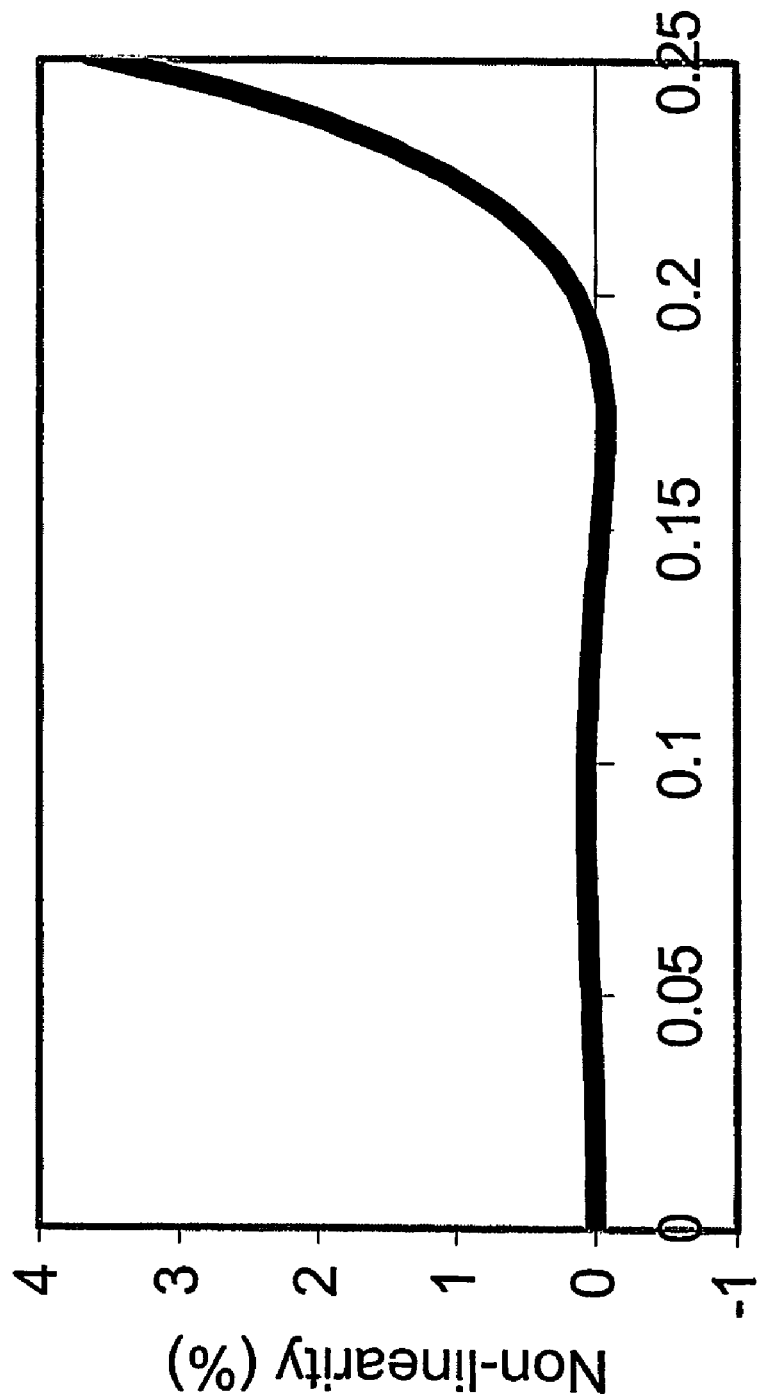

FIG. 11 shows a plot of X-gradient non-linearity at z=0 meters as a function of radial position for the primary and shield coils layout shown in FIG. 5.

Figure 12:
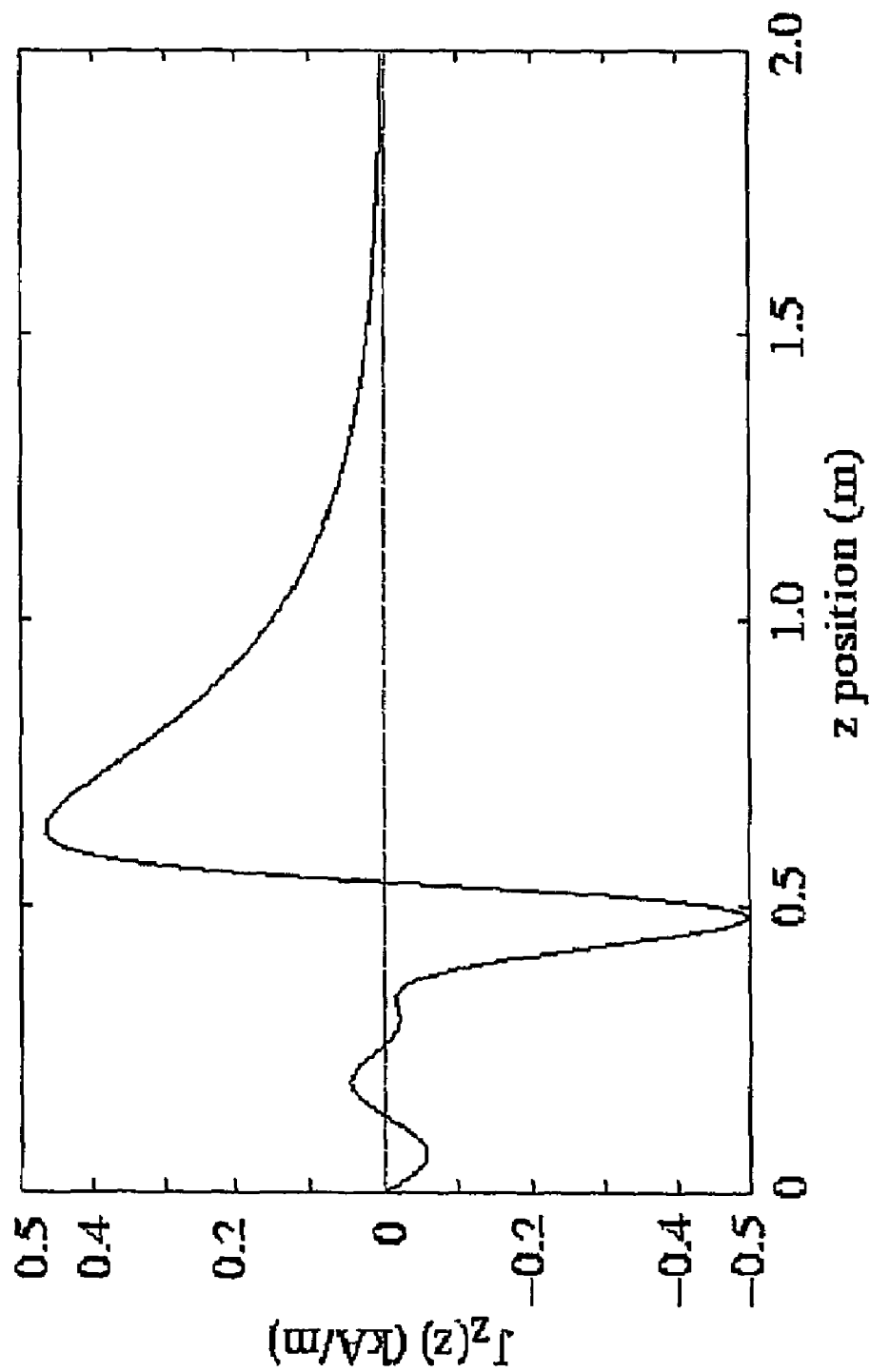

FIG. 12 shows a plot of residual eddy current distribution as a function of axial position Z produced by the coil layout shown in FIG. 5.

Figure 13:
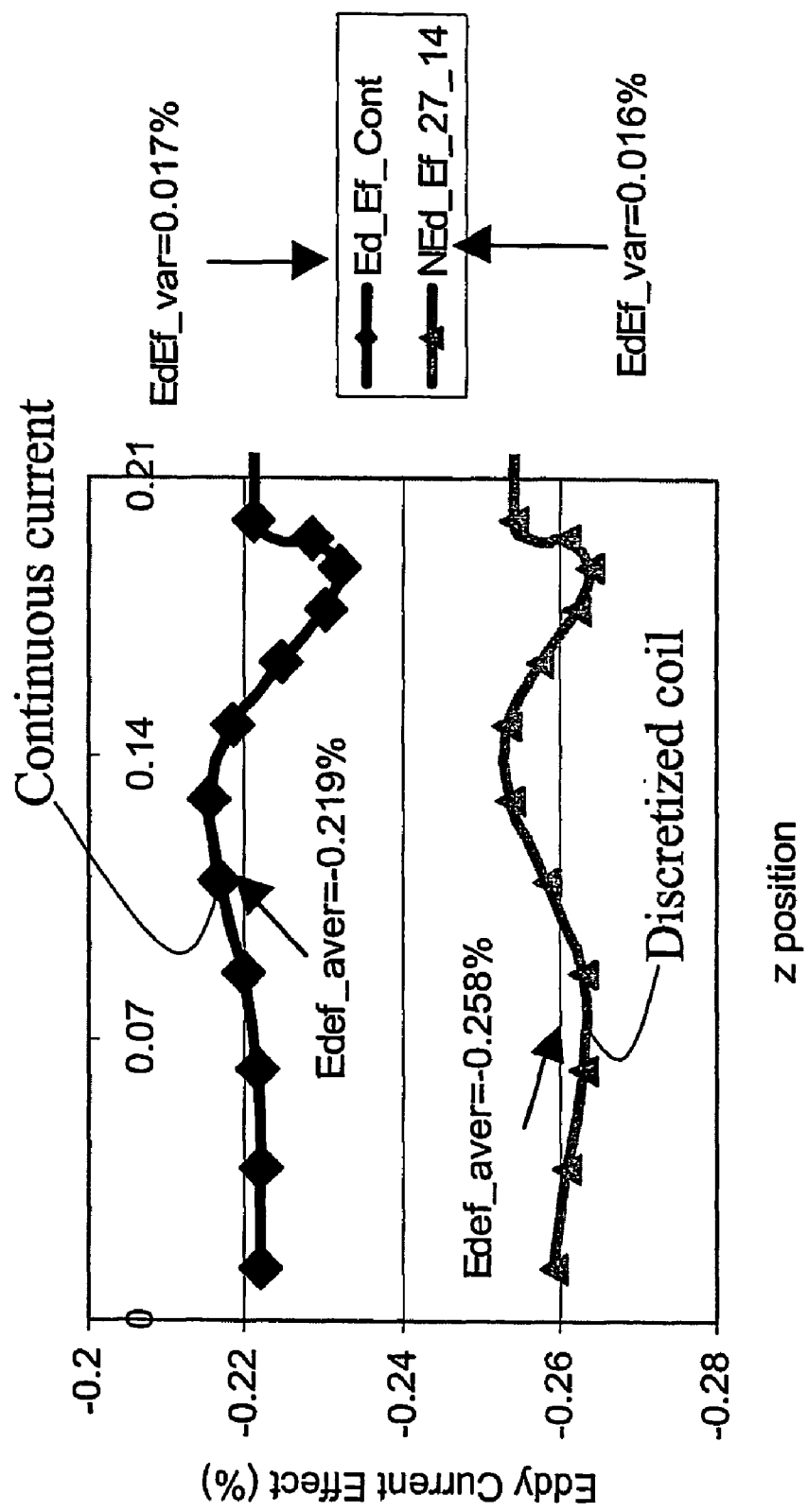

FIG. 13 shows a plot comparing eddy current effect as a function of axial position Z for the continuous current of FIG. 9 and the discretized coils of FIG. 5.

Figure 14:
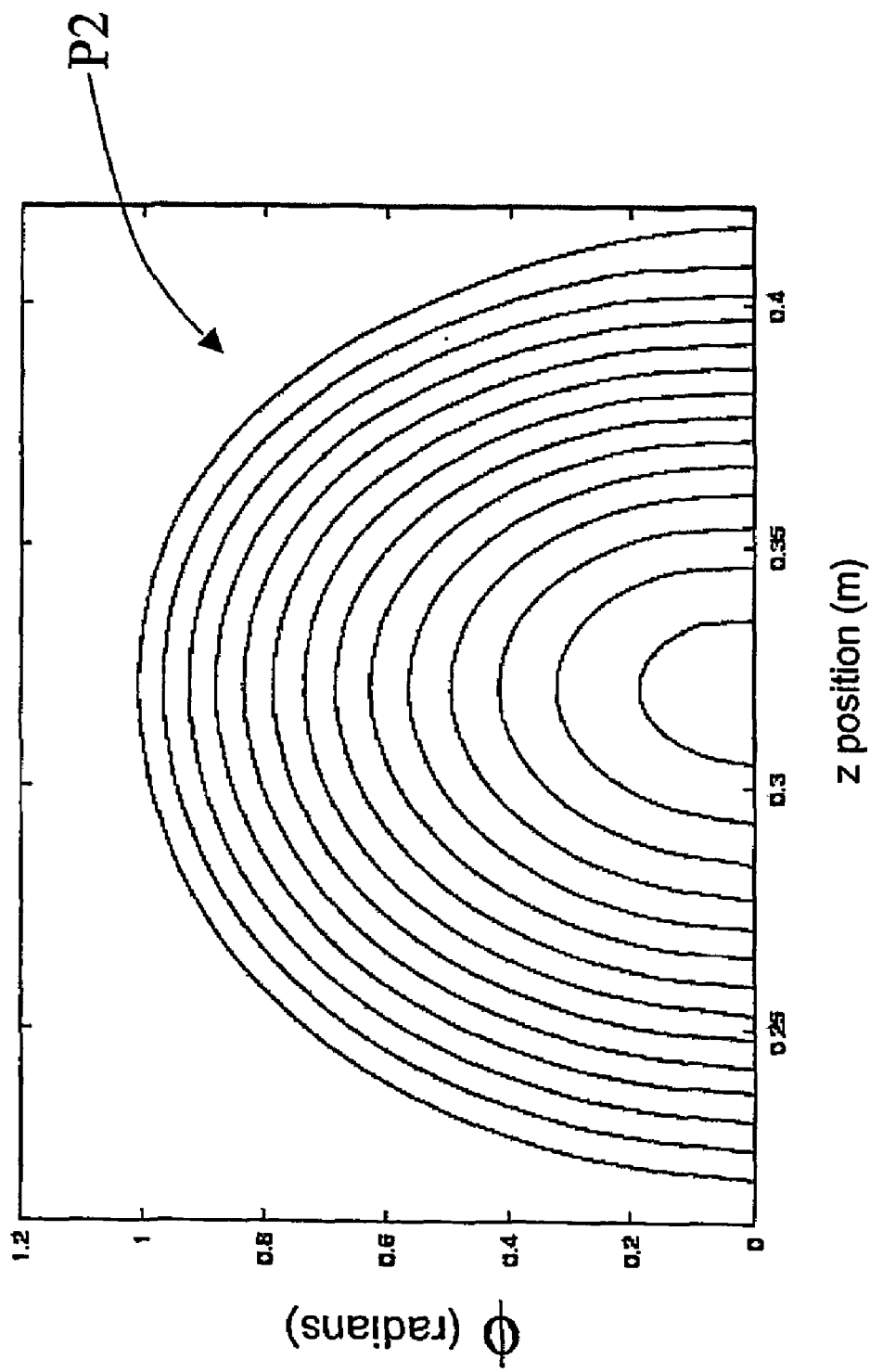

FIG. 14 shows an unfolded half-quadrant layout of a coil P2 formed by selecting fourteen turns on the primary coil of FIG. 5 that do have jumps.

Figure 15:
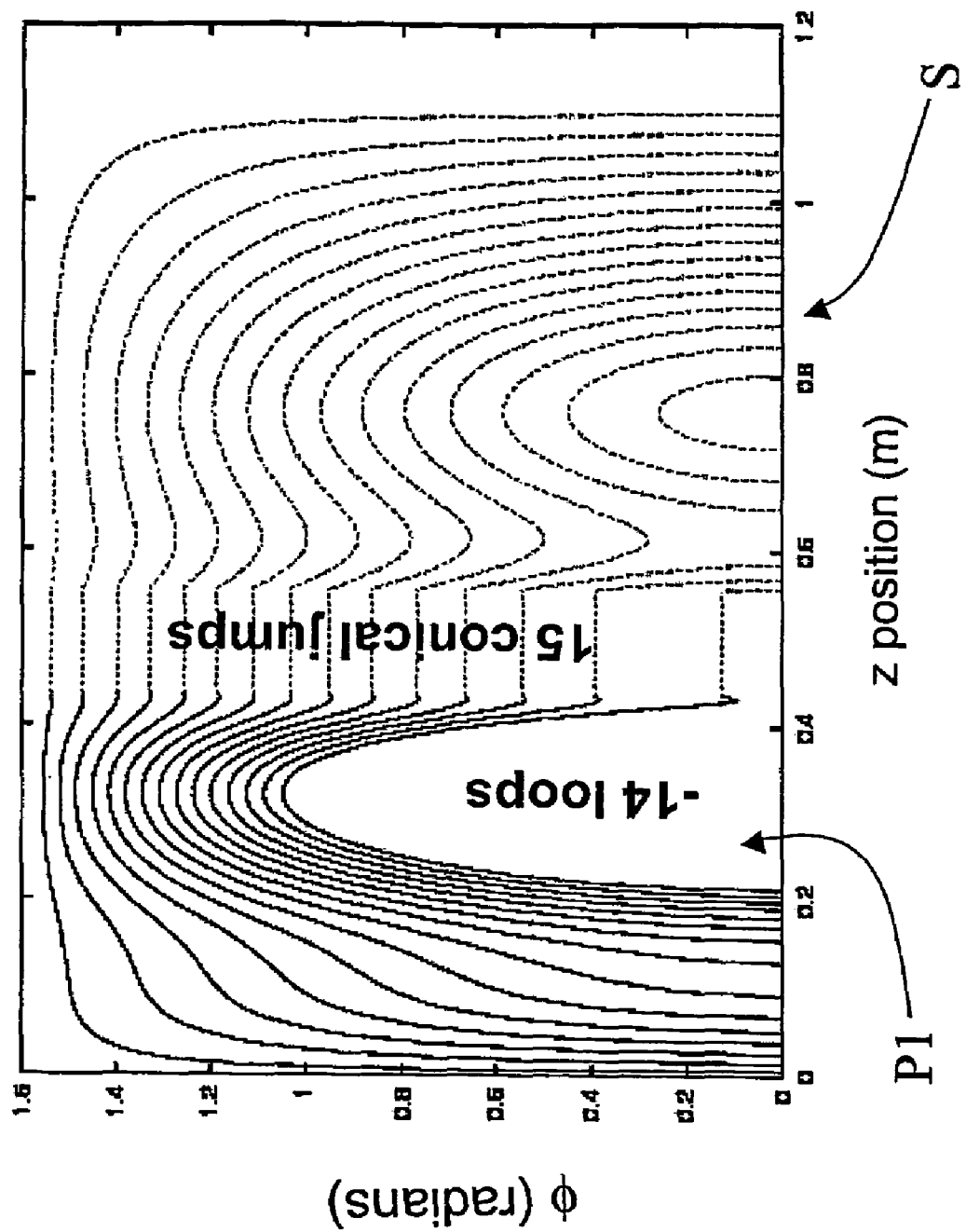

FIG. 15 shows an unfolded half-quadrant layout of a coil P1 formed by disconnecting fourteen isolated primary coil turns of the primary gradient coil P2 of FIG. 14.

Figure 16:
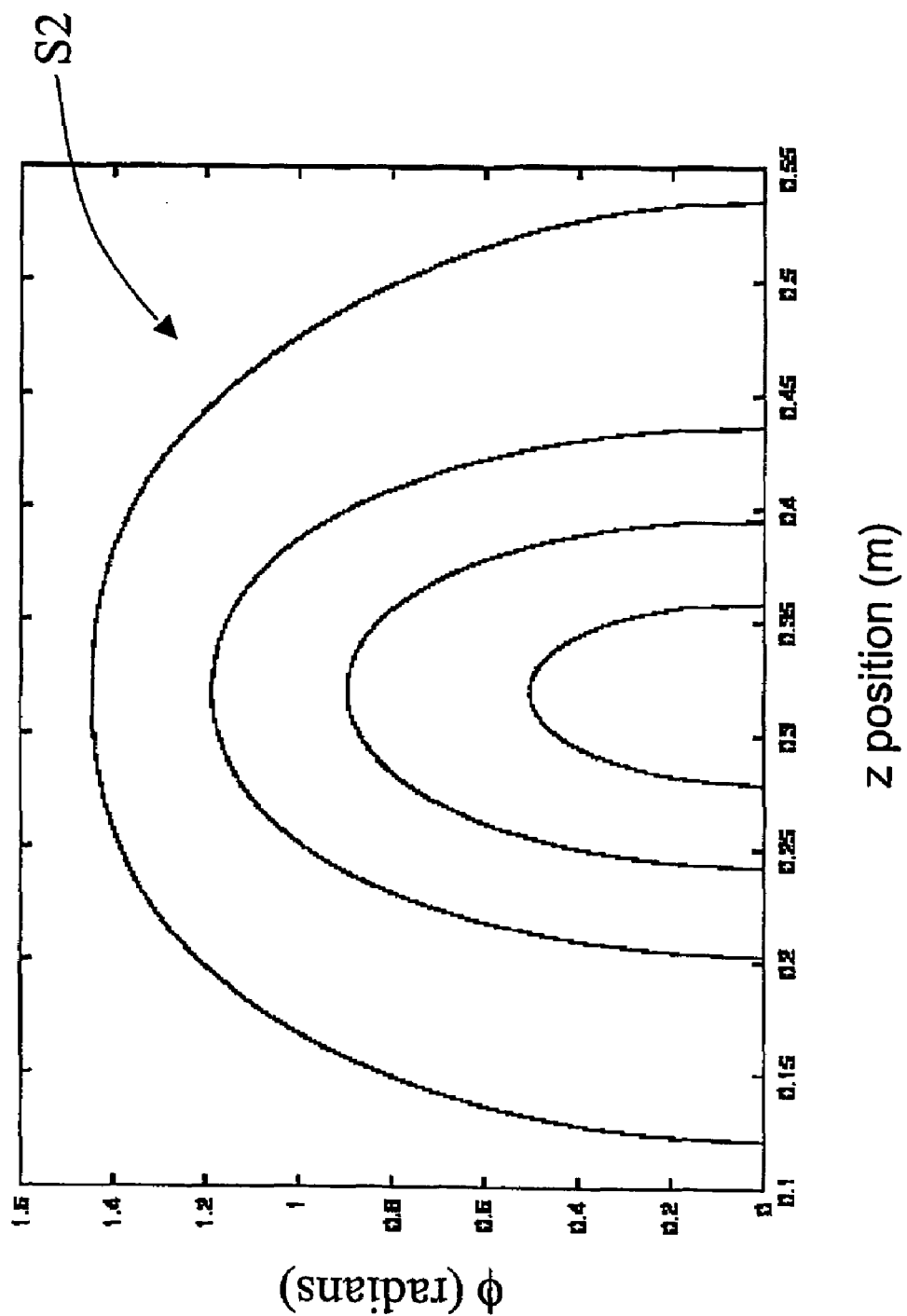

FIG. 16 shows an unfolded half-quadrant layout of a second shield coil S2 that operates in conjunction with the coil P1 to define a second field of view.

Figure 17:
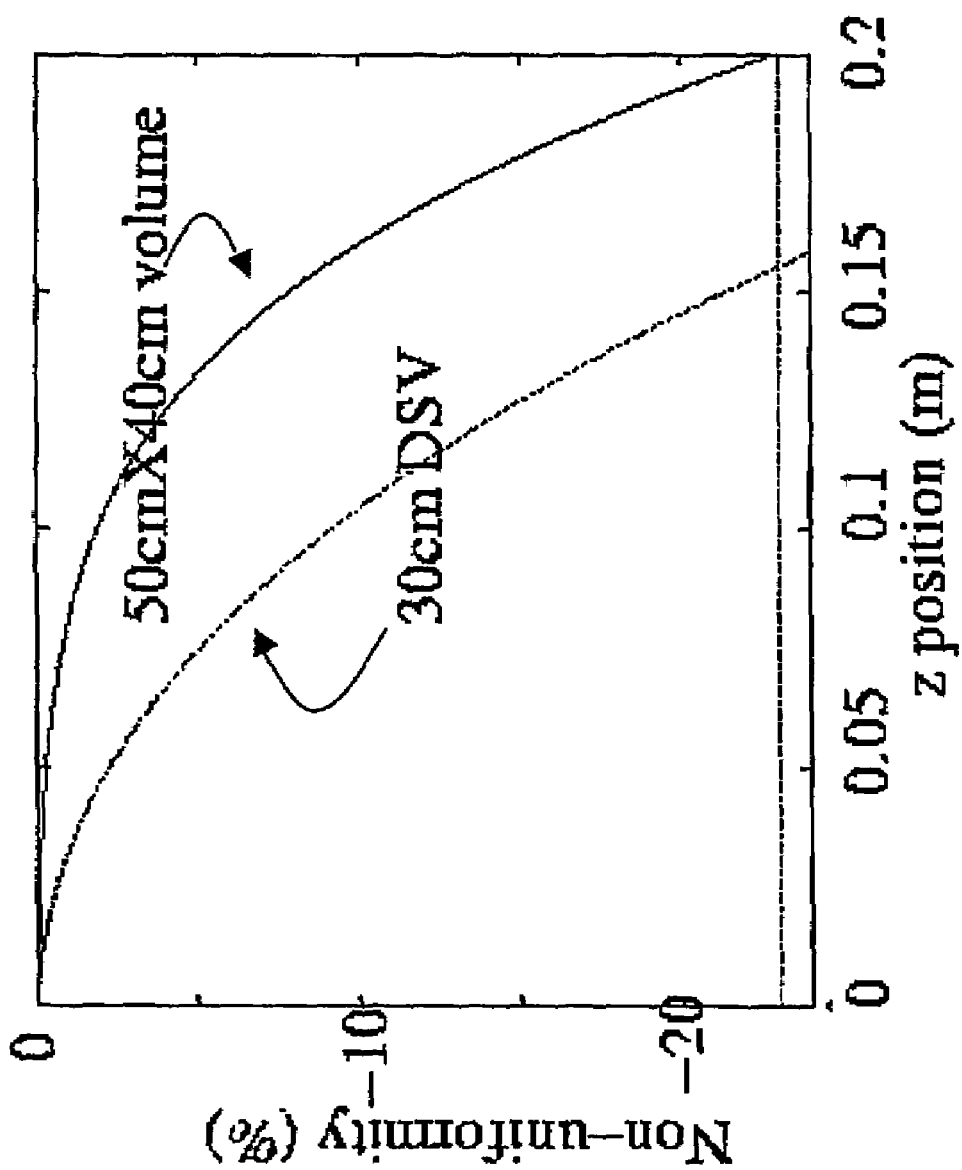

FIG. 17 shows a plot of X-gradient non-uniformity for the two discrete fields of view of the gradient coil illustrated in FIGS. 5 and 14-16.

Figure 18:
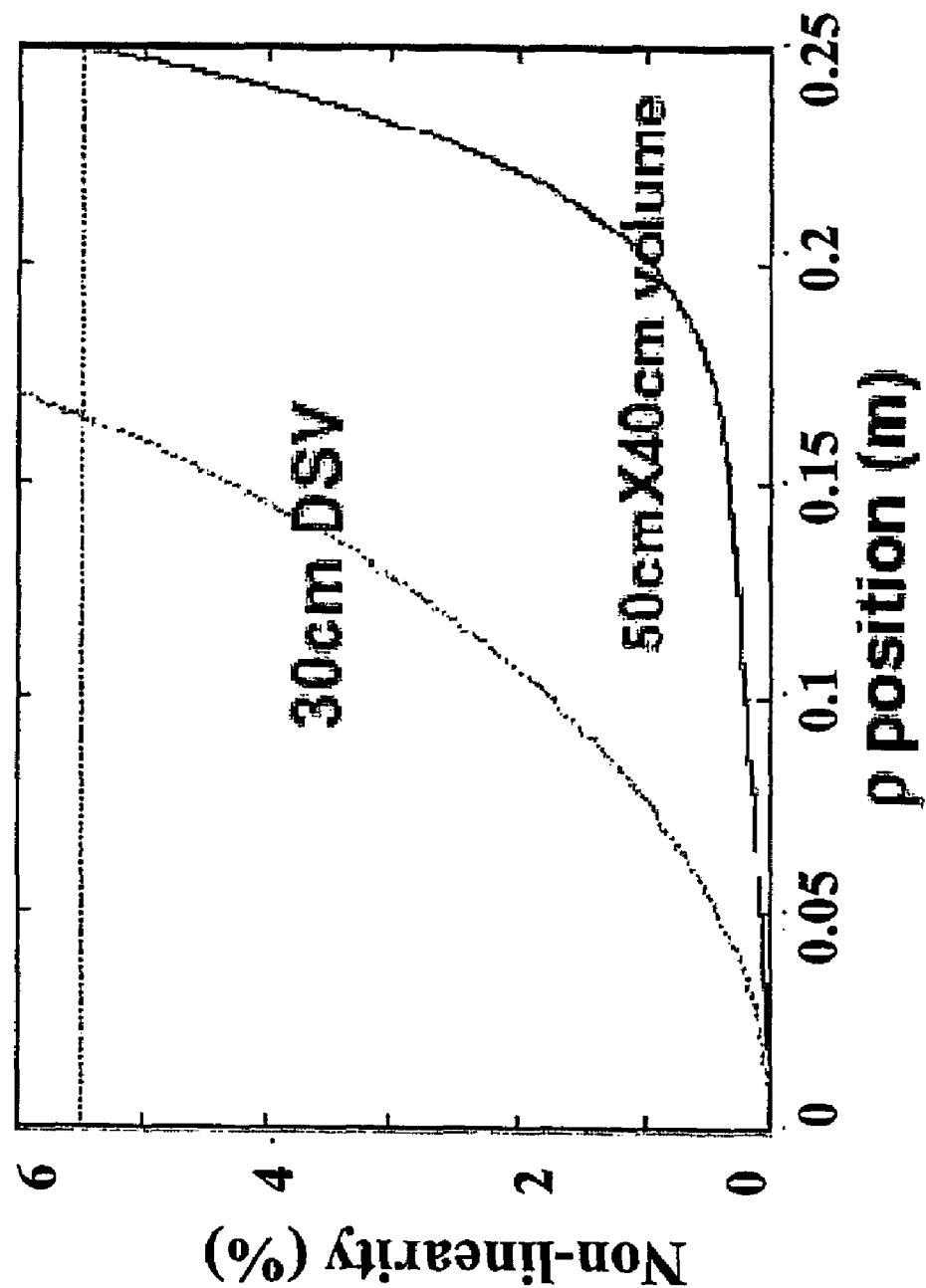

FIG. 18 shows a plot of X-gradient non-linearity for the two discrete fields of view of the gradient coil illustrated in FIGS. 5 and 14-16.

Figure 19:
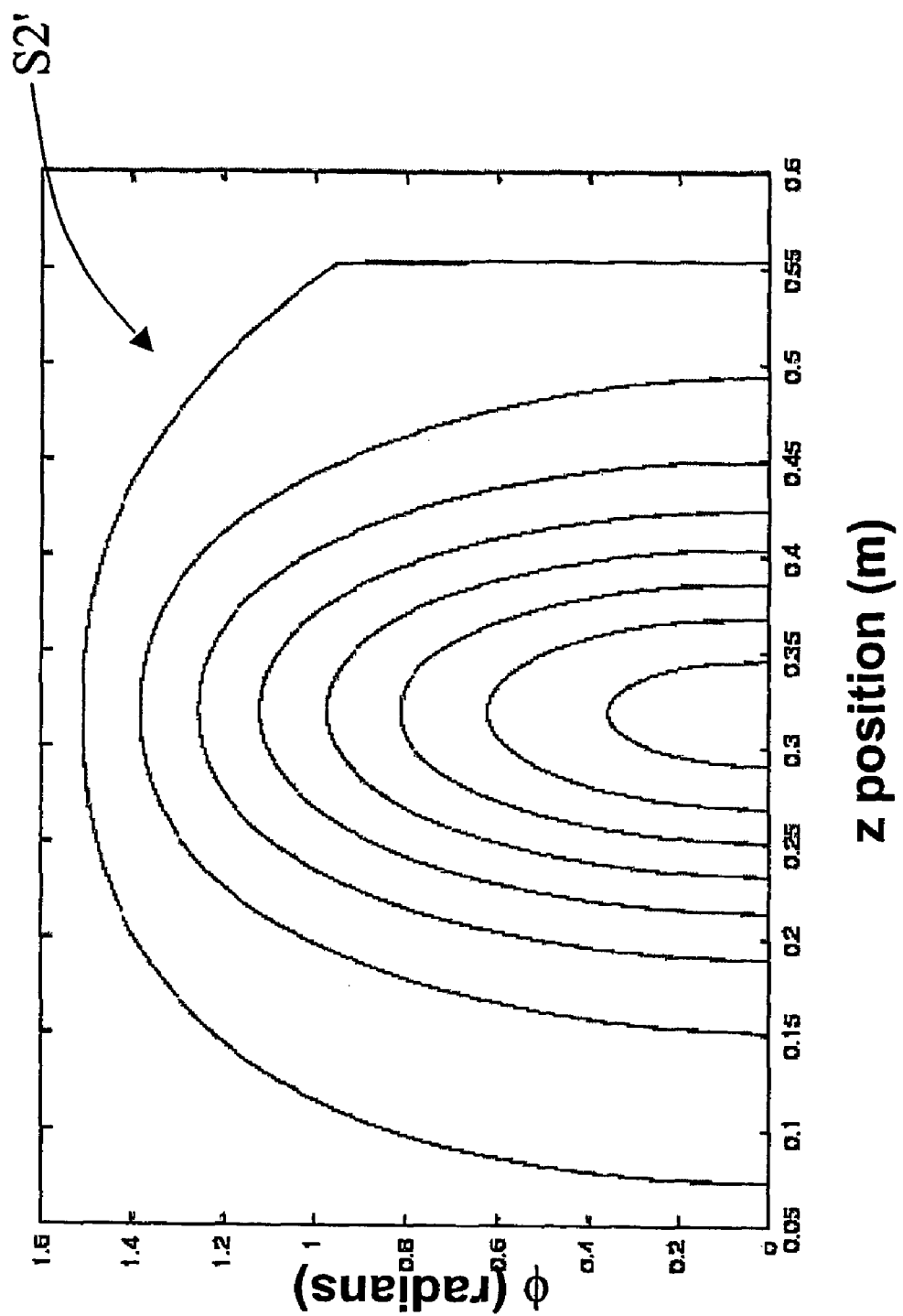

FIG. 19 shows an unfolded half-quadrant layout of a second shield coil S2' that operates in conjunction with the coils of FIGS. 5, 14, and 15 to define a discretely variable gradient coil with three fields of view.

Figure 20:
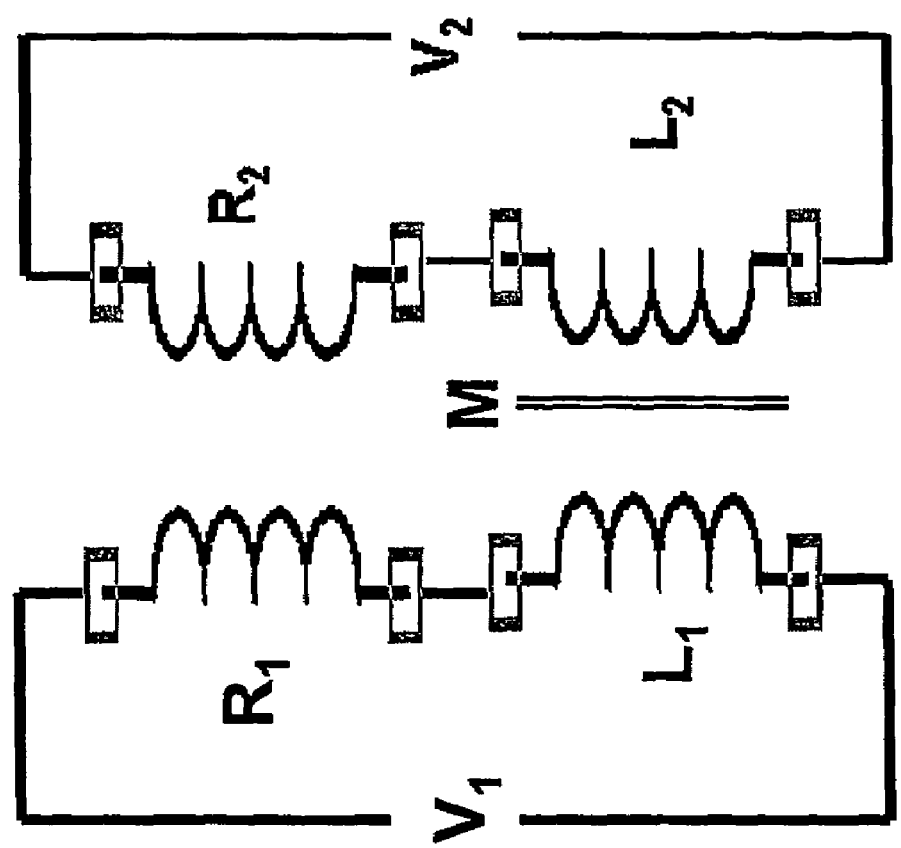

FIG. 20 shows two gradient coils driven in parallel, with nomenclature specified for computing a slew rate for the parallel-combined coils.

Figure 21:
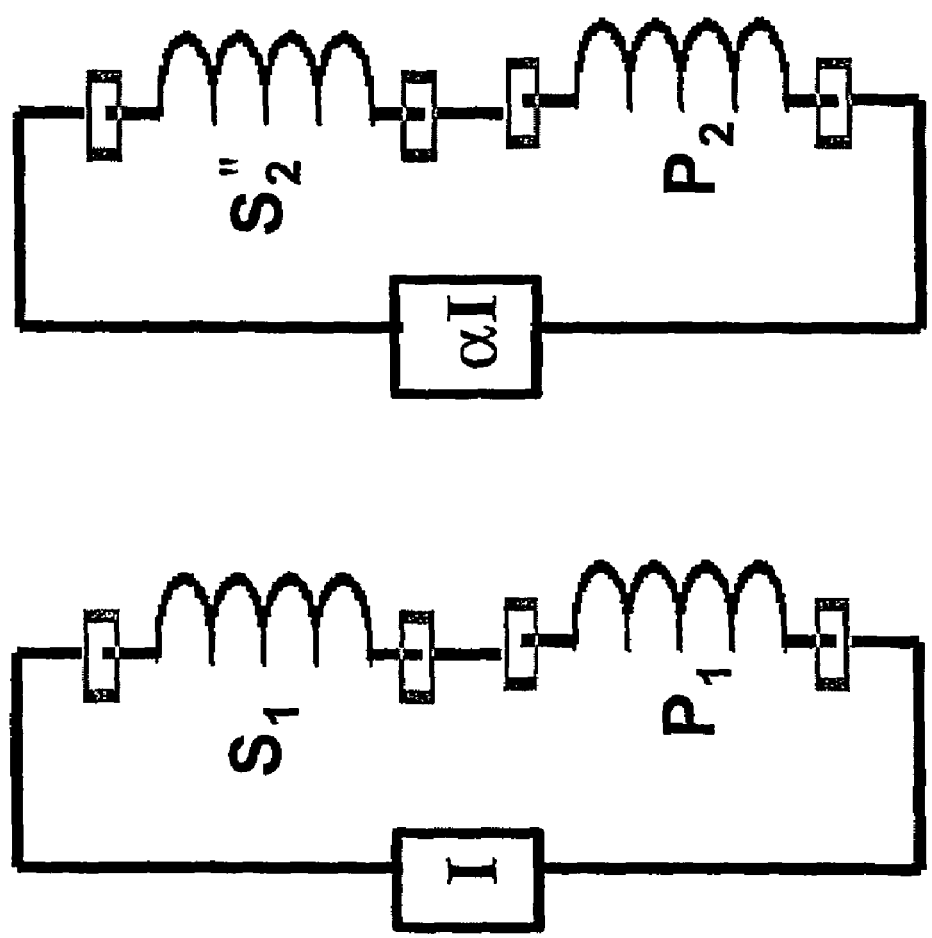

FIG. 21 shows a suitable configuration of two primary coils located on a single surface and two shield coils designed as described herein that provide a continuously variable field of view.

Figure 22:
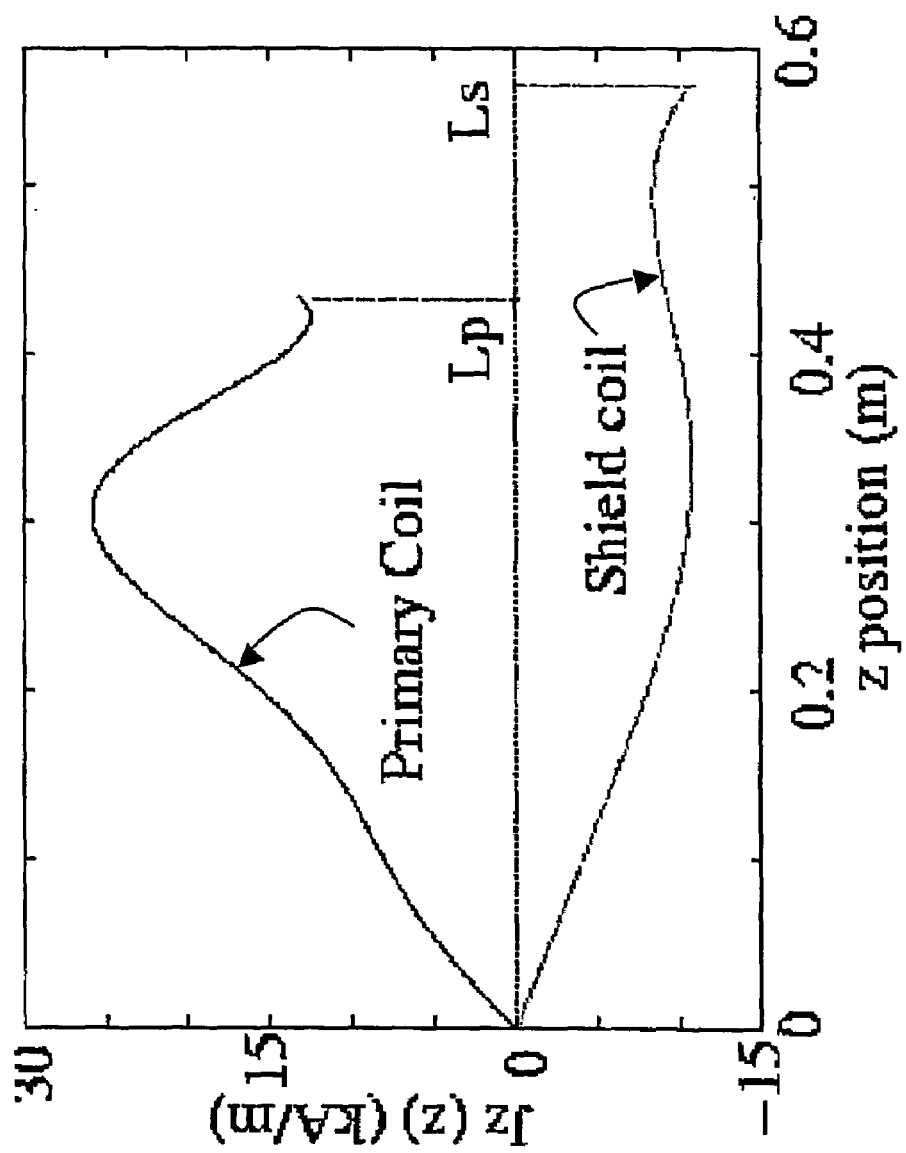

FIG. 22 shows a plot of the z-component of the current density for primary and shield coils providing a 32 cm DSV field of view.

Figure 23:
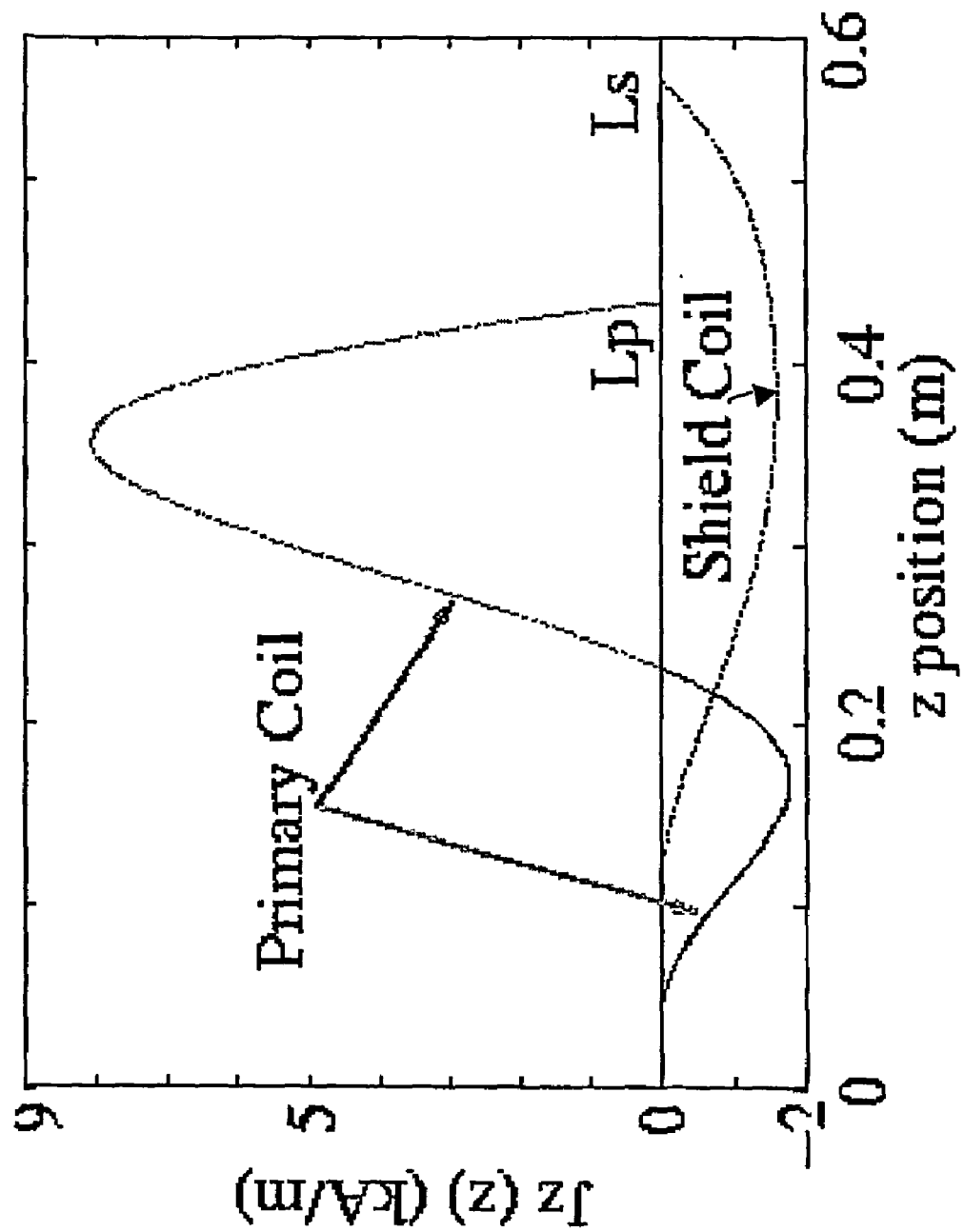

FIG. 23 shows a plot of the z-component of the current density for primary and shield coils of a correction or shim coil that cooperates with the 32 cm DSV coil of FIG. 22 to produce a continuously variable field of view.

Figure 24:
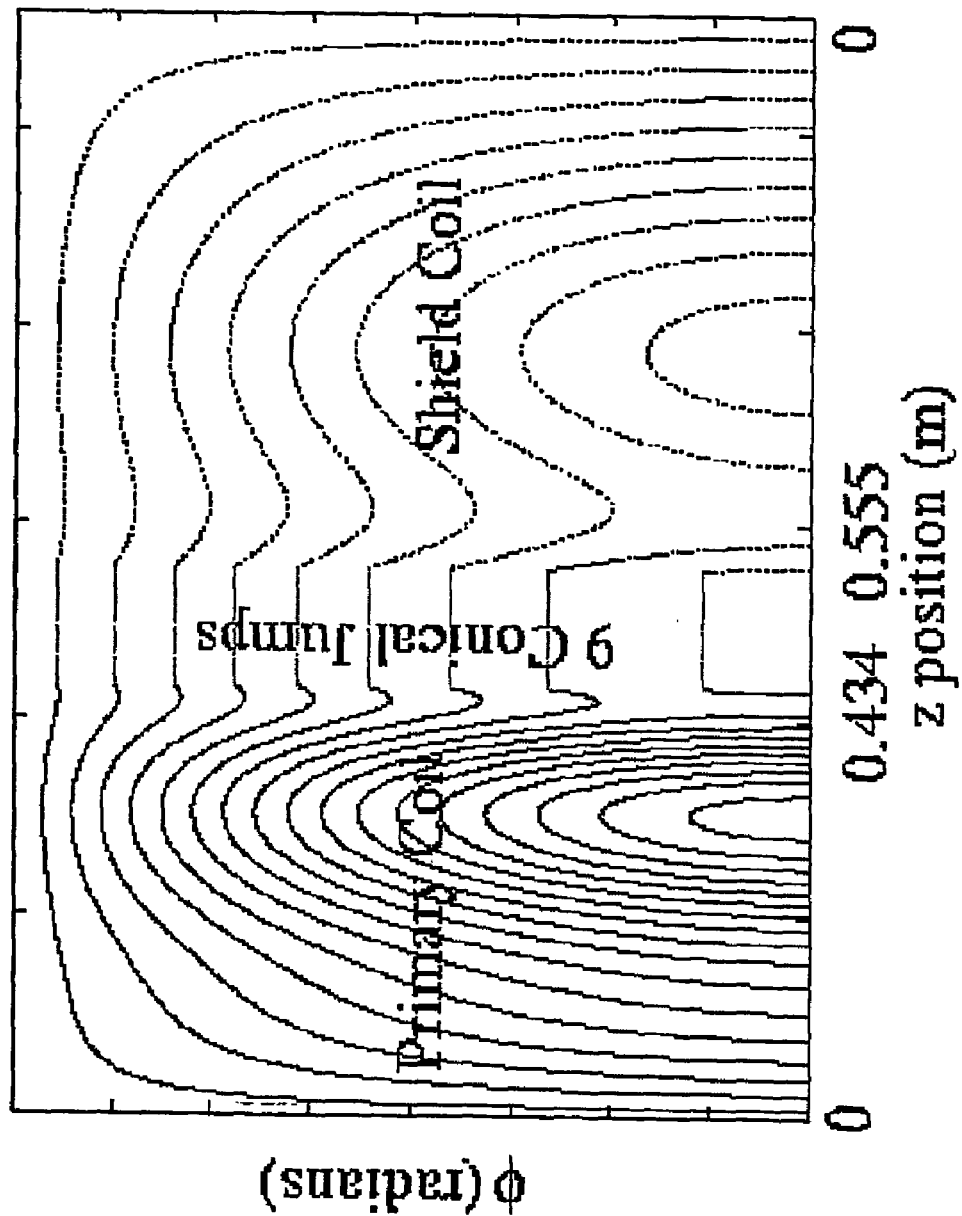

FIG. 24 shows an unfolded half-quadrant layout of the primary and shield gradient coils and the interconnecting coil jumps of the discretized current densities of the 32 cm DSV coil of FIG. 22.

Figure 25:
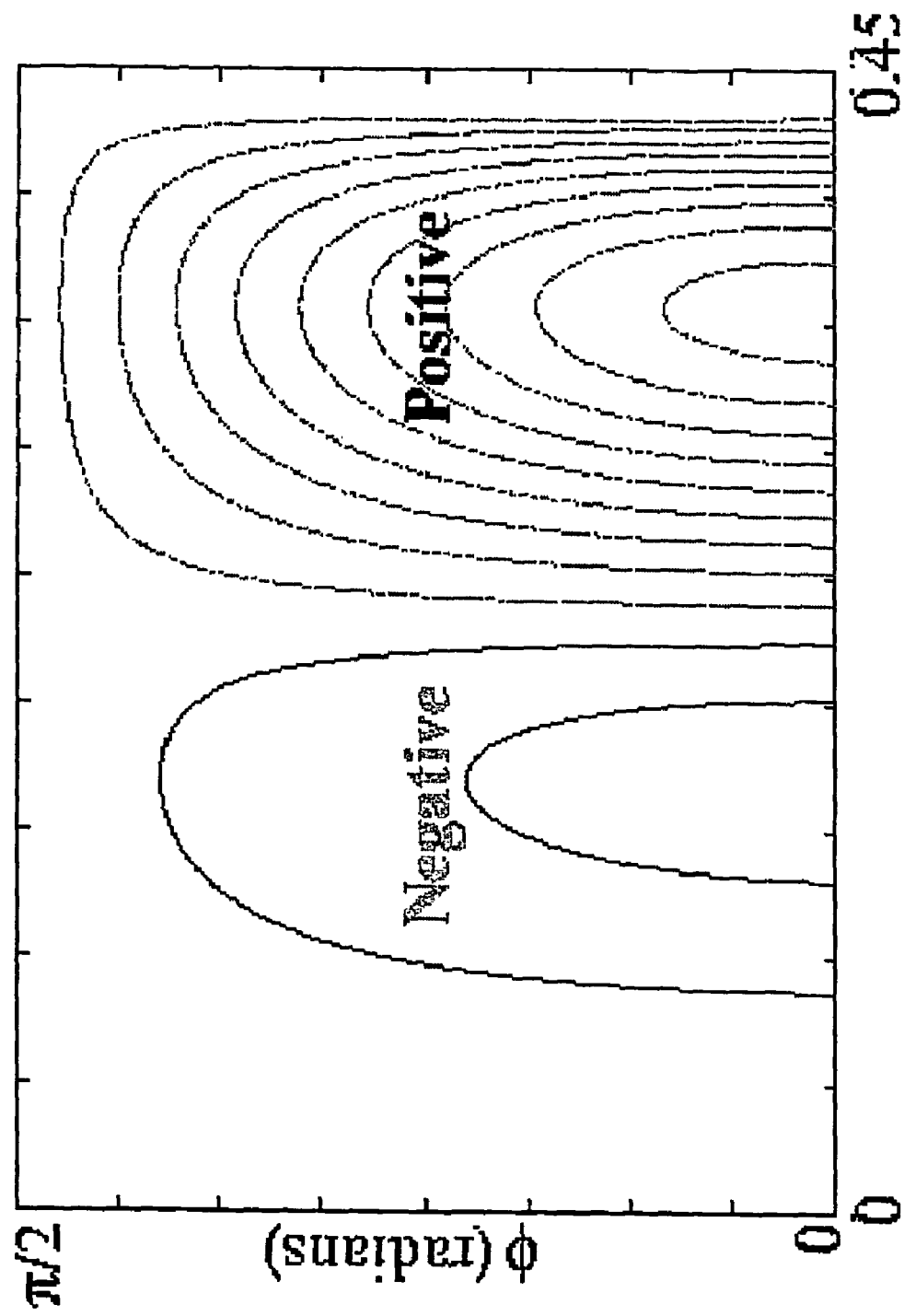

FIG. 25 shows an unfolded half-quadrant layout of the primary gradient coil of the correction coil.

Figure 26:
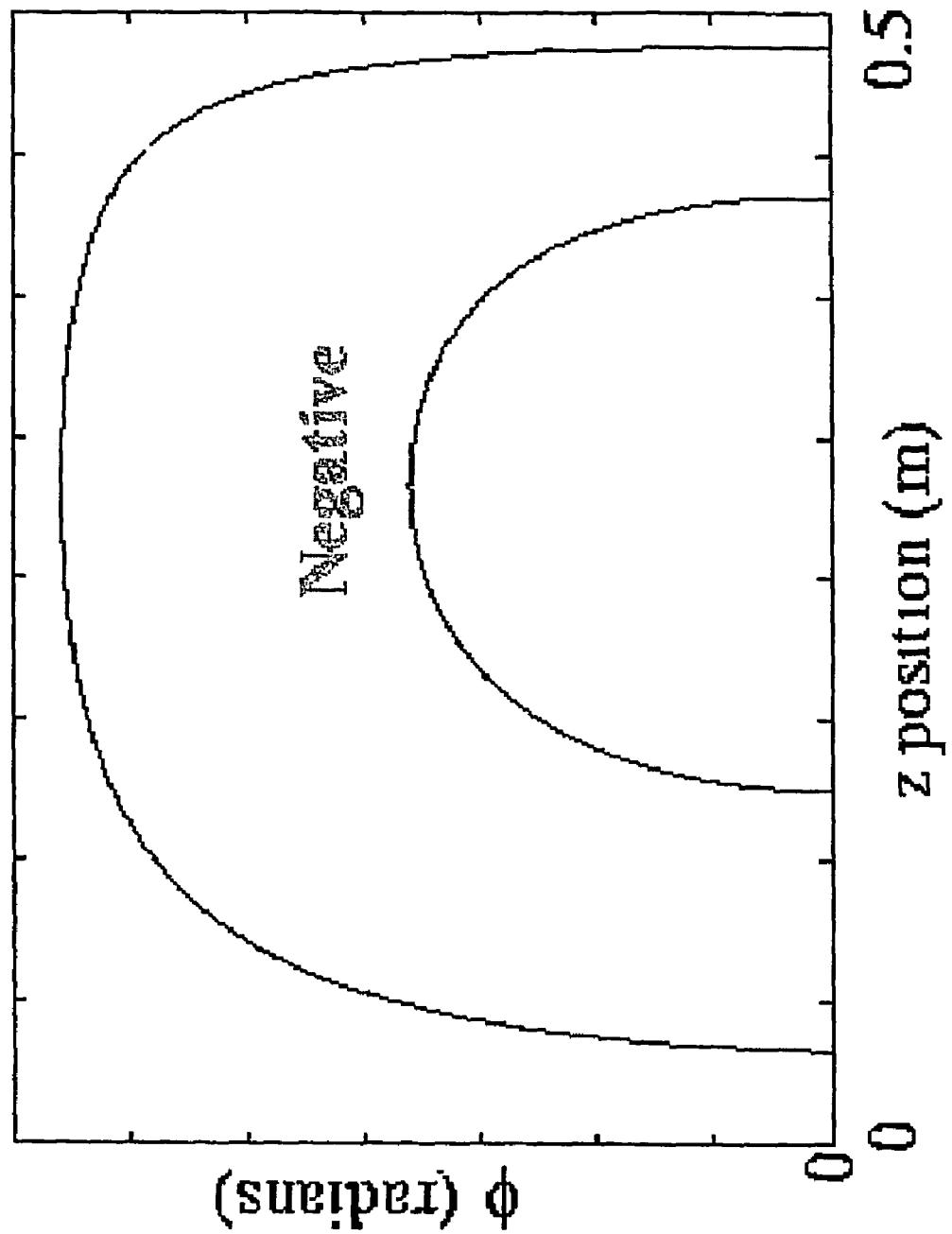

FIG. 26 shows an unfolded half-quadrant layout of the shield gradient coil of the correction coil.

Figure 1:
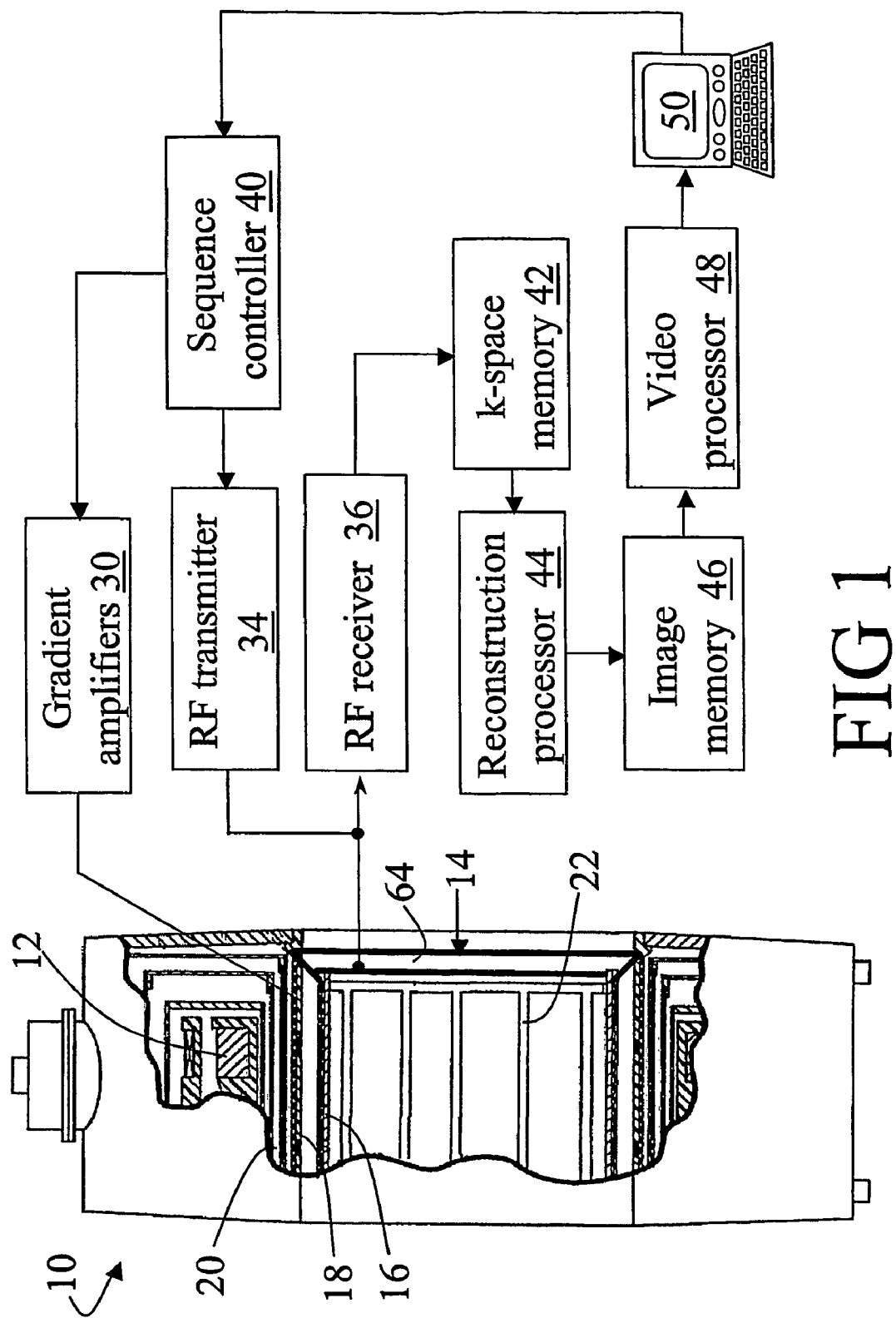
FIG. 1 shows an exemplary magnetic resonance imaging apparatus, in partial cross-section, and auxiliary components for performing magnetic resonance imaging.

With reference to FIG. 1, a magnetic resonance imaging scanner 10 includes a cylindrical main magnet 12, which is preferably superconducting and cryoshielded. The main magnet 12 defines a magnet bore 14 inside of which a patient or other imaging subject is placed for imaging. The main magnet 12 produces a spatially and temporally constant and uniform main magnetic field oriented along a longitudinal axis of the bore 14. Instead of a superconducting magnet, a non-superconducting magnet can be used. Moreover, a vertical magnet, an open magnet, or other type of main magnet can be employed instead of the illustrated horizontal cylindrical main magnet 12. In one preferred embodiment, the main magnet 12 is a short-bore magnet.

Magnetic field gradient coils include a primary gradient coil 16 and a shield gradient coil 18 that cooperatively produce magnetic field gradients in the bore 14 for spatially encoding magnetic resonance signals, for producing magnetization-spoiling field gradients, or the like. Preferably, the magnetic field gradient coils 16, 18 include coils configured to produce magnetic field gradients in three orthogonal directions including transverse x- and y-directions. In addition to the shield coil 18, a cold shield 20 provides a high conductivity eddy current surface for residual gradient fields thus protecting the magnet coils still further away. In a suitable embodiment, the cold shield 20 is integrated into a housing of the main magnet 12.

A whole body radio frequency coil assembly 22 generates radio frequency pulses for exciting magnetic resonances. The radio frequency coil assembly 22 also serves to detect magnetic resonance signals. Optionally, additional local radio frequency coils or phased radio frequency coil arrays (not shown) are included for exciting and/or detecting magnetic resonances at localized areas in the bore 14.

Gradient pulse amplifiers 30 deliver controlled electrical currents to the magnetic field gradient coils 16, 18 to produce selected magnetic field gradients. A radio frequency transmitter 34, preferably digital, applies radio frequency pulses or pulse packets to the radio frequency coil assembly 22 to generate selected magnetic resonance excitations. A radio frequency receiver 36 also coupled to the radio frequency coil assembly 22 receives magnetic resonance signals. If more than one radio frequency coil is provided (such as a local coil or phased coil array), then different coils are optionally used for the magnetic resonance excitation and detection operations.

To acquire magnetic resonance imaging data of a subject, the subject is placed inside the magnet bore 14, preferably at or near an isocenter of the main magnetic field. A sequence controller 40 communicates with the gradient amplifiers 30 and the radio frequency transmitter 34 to produce selected transient or steady state magnetic resonance configurations in the subject, to spatially encode such magnetic resonances, to selectively spoil magnetic resonances, or otherwise generate selected magnetic resonance signals characteristic of the subject. The generated magnetic resonance signals are detected by the radio frequency receiver 36, and stored in a k-space memory 42. The imaging data is reconstructed by a reconstruction processor 44 to produce an image representation that is stored in an image memory 46. In one suitable embodiment the reconstruction processor 44 performs an inverse Fourier transform reconstruction.

The resultant image representation is processed by a video processor 48 and displayed on a user interface 50, which is preferably a personal computer, workstation, or other type of computer. Rather than producing a video image, the image representation can be processed by a printer driver and printed, transmitted over a computer network or the Internet, or the like. Preferably, the user interface 50 also allows a radiologist or other operator to communicate with the magnetic resonance sequence controller 40 to select magnetic resonance imaging sequences, modify imaging sequences, execute imaging sequences, and so forth.

With reference to FIG. 2-4, the magnet 12 of the magnetic resonance imaging scanner 10 is preferably a short-bore magnet defining a cylindrical magnet bore 14. The primary and shield gradient coils 16, 18 coincide with and define axially concentric cylindrical surfaces 60, 62, respectively. The inner and outer concentric cylindrical surfaces 60, 62 have radii $R_p$, $R_s$, respectively. The shield gradient coil 18 extends axially a half-length $L_s$ along the outer cylindrical surface 62, while the primary gradient coil 16 extends axially a half-length $L_p$ along the inner cylindrical surface 60. The cold shield 20 has a length 2 $L_{CS}$. Preferably, the gradient coils 16, 18 and the cold shield 20 are bilaterally symmetric along the axial direction, and $L_s$, $L_p$, $L_{CS}$ designate half-lengths.

To provide reduced length, increased openness, and improved shielding, the axial half-length $L_s$ of the shield 30 gradient coil 18 is preferably greater than the axial half-length $L_p$ of the primary gradient coil 16. The two gradient coils 16, 18 are connected along a non-planar current-sharing surface 64 that extends between an inner contour 66 coinciding with the inner cylindrical surface 60, and an outer contour 68 coinciding with the outer cylindrical surface 62. In a preferred embodiment, the non-planar current-sharing surface corresponds to a curved surface of a frustum of a cone, where the cone has an angle a respective to an axis of the axially concentric cylindrical surfaces 60, 62. The angle a corresponds to an arctangent of a ratio of a difference between the cylindrical surface radii $R_p$, $R_s$ and a difference between the primary and secondary or shield gradient coil half-lengths $L_p$, $L_s$. However, the non-planar current-sharing surface can also have a parabolic, piece-wise conic, or other shape.

With continuing reference to FIG. 2-4 and with further reference to FIG. 5, the primary gradient coil 16 includes a fingerprint-like pattern of conductive windings or current paths coinciding with the inner cylindrical surface 60, while the shield gradient coil 18 includes a fingerprint-like pattern of conductive windings or current paths coinciding with the outer cylindrical surface 62.

With continuing reference to FIGS. 2-5 and with further reference to FIGS. 6 and 7, the primary gradient coil 16 includes isolated primary coil turns 70 that connect with other primary gradient coil turns on the surface 60. The primary gradient coil 16 also includes communicating primary coil turns 72 that each connect with at least one coil jump 74 that coincides with the current-sharing surface 64. Similarly, the shield gradient coil 18 includes isolated shield coil turns 80 that connect with other shield coil turns on the surface 62, as well as communicating shield coil turns 84 that each connect with at least one coil jump 74.

As shown in FIG. 6, each isolated primary or shield coil turn 70, 80 defines a current loop on the cylindrical surface 60, 62, respectively. As shown in FIG. 7, the communicating primary and shield coil turns 72, 82 and two coil jumps 74 define a current loop that passes back and forth across the current-sharing surface 64 via the two coil jumps 74.

Those skilled in the art will recognize that the gradient coils 16, 18 have substantial advantages over past coils, especially for short-magnet designs. By connecting the primary coil 16 and secondary or shield coil 18 with a plurality of coil jumps 74, high coil turn densities near the coil edges are reduced. Moreover, by axially flaring the shield coil 18 relative to the primary coil 16 improved shielding is obtained versus a design using primary and shield coils of equal lengths. The axial flaring of the shield coil 18 is accommodated by the non-planar current-sharing surface 64 to permit a combination of a flared shield and multiple coil jumps.

With returning reference to FIG. 3, a suitable method for designing the gradient coils 16, 18 uses the following parameters. The angle α is called a flare angle. The axial coil half-lengths $L_p$, $L_s$, and the cold shield half-length $L_{CS}$ are shown and were discussed previously. Preferably, $L_p<L_s<L_{CS}$, with $L_{CS}$ substantially larger than $L_s$. The primary coil 16 coincides with and defines the inner cylindrical surface 60 which has a radius $R_p$. The shield coil 18 coincides with and defines the outer cylindrical surface 62 which has a radius $R_s$. The cold shield 20 is preferably cylindrical with a radius $R_{CS}$, and is preferably coaxial with the cylindrical surfaces 60, 62. For a preferred embodiment, $R_p<R_s<R_{CS}$.

The gradient coil design goals include producing: (i) given gradient strength $G_X$ or $G_Y$ at the isocenter of the magnet bore 14; (ii) high slew rate; (iii) good quality gradient magnetic field characteristics, such as linearity and uniformity, within a given diameter spherical volume (DSV); and (iv) good shielding. It is recognized that leakage of the magnetic field into the conductive cold shield 20 will be present. This leakage is responsible for the residual eddy currents induced in the cold shield 20 when the gradient coil 16, 18 is operated. These residual eddy currents can affect the quality of the gradient field inside the DSV and are characterized by the residual eddy current effect, which is defined as follows:

$$\text{ed\_ef}(r)|_{DSV} = \frac{B_z^{\text{eddy\_current}}(r)}{B_z^{\text{Grad}}(r)}|_{DSV} * 100\% \quad (1)$$

where the symbol $|_{DSV}$ indicates that the residual eddy current effect is evaluated at the surface of the DSV. One skilled in is the art knows that if the above characteristic is reasonably constant as a function of spatial position, r, then the residual eddy current effect can be substantially corrected with gradient pre-emphasis. Thus, the absolute level of eddy current magnitude, although generally desired or preferred to be as small as possible, is not necessarily the most important aspect.

In designing a self-shielded gradient coil, which from the beginning has finite lengths of the primary and shield coils, shielding conditions for the normal component of the total magnetic field $B_r(r)$ on the surface of the shield coil are typically imposed according to:

$$B_\rho(r)|_{\rho=R_x} = 0 \quad (2)$$

$$\varepsilon(k) = F_s(k) + R(k)F_p(k) \to 0, \quad R(k) = \frac{R_p I_1'(kR_p)}{R_s I_1'(kR_s)}$$

$$F_{p,s}(k) = \int_{-L_{p,s}}^{L_{p,s}} f_\varphi^{(p,s)}(z)\cos(kz)dz$$

where $f_\phi^{(p,s)}(z)$ is the φ-component of the current density on the primary (p) or shield (s) coil, $R_{p,s}$, $L_{p,s}$ are the radii and half-length of the primary (p) or shield (s) coil, respectively, and $I_1'(kR)$ is a derivative of a Bessel function of the first kind $I_1(kR)$. Equation (2) holds for any k, and is substantially restrictive. The shielding error function $\varepsilon(k)$ is a measure of how well the gradient coil is shielded. To design a well-shielded gradient coil Equation (2) leads to high current density on the primary coil with a negative lobe near its edge, leading therefore to high inductance.

If the residual eddy current effect is non-zero it should have small variation over the imaging volume to be correctable. This means, that the variation of the residual eddy current effect should be small, even if the residual eddy current effect is about, say, 10%. Therefore, the coil is designed to satisfy the conditions that there is no high current density near the ends of the coils and the residual eddy current effect is correctable.

The gradient coil design includes the following process operations: (i) allowing the current to flow off the end of the primary coil 16 to the shield coil 18 along the conical or other non-planar current-sharing surface 64 disposed therebetween; (ii) the cold shield 20 is included in the coil design; and (iii) the residual eddy current effect is considered as a variable in the design together with gradient field quality characteristics. The latter will be introduced as point constraints.

In the following, an exemplary X-gradient coil design is described. Those skilled in the art can readily adapt the exemplary X-gradient coil design to the designing of a Y-gradient coil. The current distribution on the X-gradient coil in terms of cylindrical coordinates has the following form:

$$J(r) = e_\rho J_\rho(r) + e_\varphi J_\varphi(r) + e_z J_z(r) \quad (3)$$

$$J_\rho(r) = J^{(p)}(\rho)\{\delta(z - Z(\rho)) + \delta(z + Z(\rho))\}\Theta(\rho - R_p)\Theta(R_s - \rho)\sin(\varphi)$$

$$J_\varphi(r) = \{f_\varphi^{(p)}(z)\delta(\rho - R_p)\Theta(z + L_p)\Theta(L_p - z) + f_\varphi^{(s)}(z)\delta(\rho - R_s)\Theta(z + L_s)\Theta(L_s - z)\}\cos(\varphi)$$

$$J_z(r) = \{f_z^{(p)}(z)\delta(\rho - R_p)\Theta(z + L_p)\Theta(L_p - z) + f_z^{(s)}(z)\delta(\rho - R_s)\Theta(z + L_s)\Theta(L_s - z)\}\sin(\varphi) + J^{(z)}(\rho)\{\delta(z - Z(\rho)) - \delta(z + Z(\rho))\}\Theta(\rho - R_p)\Theta(R_s - \rho)\sin(\varphi)$$

$$Z(\rho) = L_p + (\rho - R_p)\cot(\vartheta), \quad \cot(\vartheta) = \frac{L_s - L_p}{R_s - R_p}$$

The continuity equation $\nabla \cdot J(r) = 0$ applied to the current $J(r)$ given in Equation (3) above leads to the following equations:

$$R_p f_z^{(p)'}(z) = f_\varphi^{(p)}(z), \quad R_s f_z^{(s)'}(z) = f_\varphi^{(s)}(z), \quad (4)$$

$$\frac{\partial(\rho J^{(\rho)}(\rho))}{\partial \rho} = 0 \rightarrow J^{(\rho)}(\rho) = \frac{C}{\rho},$$

$$J^{(\rho)}(R_p) = f_z^{(p)}(L_p), \quad J^{(\rho)}(R_s) = -f_z^{(s)}(L_s),$$

$$J^{(z)}(\rho) = J^{(\rho)}(\rho)\cot(\vartheta),$$

$$C = R_p f_z^{(p)}(L_p) = -R_s f_z^{(s)}(L_p)$$

where the functions $f_z^{p,s}(z)$ are suitably represented as Fourier series according to:

$$f_z^{(p)}(z) = \sum_{n=1} a_n^{(p)} \sin\left(\frac{\pi n}{2L_p} z\right), \quad f_z^{(s)}(z) = \sum_{n=1} a_n^{(s)} \sin\left(\frac{\pi n}{2L_s} z\right) \quad (5)$$

with the coefficients $\alpha_n^{(p)}$, $\alpha_n^{(s)}$ determined through extremization of the following functional:

$$W = E - \sum_i (B_z^{coil}(r_i) - R_i)\lambda_i - \sum_j (B_z^{CS}(r_j) - C_j B_z^{coil}(r_j))\Lambda_j - \quad (6)$$

$$(f_z^p(L_p) - A_p)\Lambda_p - \left(f_z^s(L_s) + \frac{R_p}{R_s}A_p\right)\Lambda_s$$

where: E represents total energy stored in the magnetic fields of the gradient coil 16, 18 and the cold shield 20; $B_z^{coil}(r_i)$ is the z-component of the coil magnetic field at a set of points $r_i$ inside the DSV where the field has predetermined values $B_i$; $B_z^{CS}(r_j)$ is the z-component of the magnetic field produced by the cold shield 20 at a set of points $r_j$ on the surface of the DSV; $B_z^{coil}(r_j)$ is the z-component of the coil's magnetic field at the same set of points; and $C_j$ is a set of numbers that govern the residual eddy current effect. Finally, $\lambda_i$ and $\Lambda_j$ are the corresponding Lagrange multipliers. The quantity $A_p$ is a desired value of the z-component of the current density on the primary coil at its edge, and the quantity $$-\frac{R_p}{R_s}A_p$$

is the value of the z-component of the current density at the edge of the shield coil. The continuity conditions are represented by the last two terms in Equation (6) and $\Lambda_p$, $\Lambda_s$ are the corresponding Lagrange multipliers for the current continuity. The quantities $A_p$ and $C_j$ are not variables and can be chosen arbitrarily. In deriving the Equation (6), we have assumed that the normal component of the total magnetic field vanishes on the surface of the magnet cold shield 20, which has radius $R_{CS}$, which is assumed much longer than the length of the gradient set. This gives the following equation for the cold shield residual eddy current:

$$f_\varphi^{CS}(z) = \frac{1}{\pi}\int_0^\infty F_\varphi^{CS}(k)\cos(kz)dk \quad (7)$$

$$F_\varphi^{CS}(k) = -R(k, R_p, R_{CS})F_\varphi^p(k) - R(k, R_s, R_{CS})F_\varphi^s(k) - 2\frac{R_p f_z^p(L_p)}{R_{CS}}\int_{R_p}^{R_s}\frac{I_1(k\rho)}{I_1'(kR_{CS})}\cos(kZ(\rho))\frac{d\rho}{\rho},$$

$$R(k, R, R_{CS}) = \frac{RI_1'(kR)}{R_{CS}I_1'(kR_{CS})}$$

where the Fourier transforms $F_{p,s}(k)$ of the primary and the shield current distributions are given in Equation (2). Variation of the functional W of Equation (6) with respect to $\alpha_n^p$, $\alpha_n^s$ determines the solution in terms of continuous current distributions.

Optimization of the functional given in Equation (6) with respect to $\alpha_n^{(p)}$ and $\alpha_n^{(s)}$ determines a suitable solution by adjusting the value of the current density at the edge of the primary coil. After a solution is found the continuous current distributions on primary coil, shield coils and the interconnecting surface are discretized such that each loop on the primary coil carries the same current I, and each loop on the shield coil carries opposite current. The discretized coil is tested for its performance: gradient strength at isocenter, linearity and uniformity of the gradient strength over the DSV, and slew rate and residual eddy current effect.

The continuous current distributions are discretized and approximated by coils 70, 72, 74, 80, 82 carrying current along a current path. A suitable fingerprint pattern of the primary and shield coils 16, 18 and coil jumps 74 determined by the forgoing process is shown in FIG. 5. The left and right half of the coil are the primary and shield coils 16, 18 respectively joined by coil jumps 74 at fixed angular positions φ along the current-sharing surface 64 that connects the concentric inner and outer cylindrical surfaces 60, 62.

With continuing reference to FIG. 5 and with further reference to FIGS. 6 and 7, the two kinds of current paths, namely the isolated primary and shield coil turns 70, 80 exemplarily shown in FIG. 6 and the communicating primary and shield coil turn 72, 82 shown in FIG. 7 are generated. The isolated current loops 70, 80 reside only on the primary or shield coil 16, 18, that is, only on one of the two cylindrical surfaces 60, 62. The communicating current paths 72, 82 define current loops that reside on both the primary and shield coils 16, 18, that is, on both of the two cylindrical surfaces 60, 62, with coil jumps 74 defining current jumps or interconnections between them.

The $B_z$ field from all of these paths is calculated to determine residual eddy currents in the cold shield 20, which can be compared to the continuous current residual eddy current effects on the DSV. Each isolated loop 70, 80 resides on either the primary coil 16 or shield coil 18 and is closed on itself. Examples of these loops are shown in FIG. 6, which shows an isolated primary loop 70 on the inner cylindrical surface 60 and an isolated shield coil loop 80 located in the first quadrant, for example. Each loop carries a current I. The current on the isolated primary coil loop 70 flows clockwise, while the current on the shield coil loop 80 flows counterclockwise. Exemplary communicating primary and shield loops 72, 82 defining a current loop passing back and forth across the non-planar current sharing surface 64 is shown in FIG. 7.

A suitable process for calculating the magnetic field and associated residual eddy current in the magnet cold shield 20 from the discretized coil 16, 18 is the path-integral approach. The coil is discretized, so an equation describing each loop is known, i.e. the equations $\phi=f_p(z)$, $\phi=f_s(z)$. For the isolated loops shown in FIG. 6, the conditions $f_p(p1)=f_p(p2)=0$, $f_s(s1)=f_s(s2)=0$ apply. For the communicating loops shown in FIG. 7, different conditions $f_p(p1)=f_s(s1)=0$, $f_p(L_p)=\phi_f$, $f_s(L_s)=\phi_f$ apply, where $\phi_f$ is the angle at which the current-sharing coil jump occurs. Rather than the parameters $p_1$, $p_2$, $s_1$, $s_2$, the description henceforth uses $z_i$ and $z_f$.

The current distribution produced by the communicating loops 72, 82 shown in FIG. 7 is given by:

$$J(r) = e_\rho J_\rho(r) + e_\varphi J_\varphi(r) + e_z J_z(r) \qquad (8)$$

$$J_\rho(r) = J^\rho(\rho)\delta(z - Z(\rho))\Theta(\rho - R_p)\Theta(R_s - \rho)\{\delta(\varphi - \varphi_f) - \delta(\varphi + \varphi_f)\},$$

$$J_\varphi(r) =$$
$$Q_p R_p f_p'(z)\{\delta(\varphi - f_p(z)) + \delta(\varphi + f_p(z))\}\delta(\rho - R_p)\Theta(z_f^p - z)\Theta(z - z_i^p) +$$
$$Q_s R_s f_s'(z)\{\delta(\varphi - f_s(z)) + \delta(\varphi + f_s(z))\}\delta(\rho - R_s)\Theta(z_f^s - z)\Theta(z - z_i^s),$$

$$J_z(r) = B_p\{\delta(\varphi - f_p(z)) - \delta(\varphi + f_p(z))\}\delta(\rho - R_p)\Theta(z_f^p - z)\Theta(z - z_i^p) +$$
$$B_s\{\delta(\varphi - f_s(z)) - \delta(\varphi + f_s(z))\}\delta(\rho - R_s)\Theta(z_f^s - z)\Theta(z - z_i^s) +$$
$$J^z(\rho)\delta(z - Z(\rho))\Theta(\rho - R_p)\Theta(R_s - \rho)\{\delta(\varphi - \varphi_f) - \delta(\varphi + \varphi_f)\}$$

where in Equation (8) $Q_p$, $B_p$, $Q_s$, $B_s$ are unknown constants and $J^\rho(\rho)$, $J^z(\rho)$ are unknown functions to be determined from the continuity equation $\nabla \cdot J(r)=0$. Thus, $$Q_p = B_p = \frac{I}{R_p}, \qquad (9)$$

$$Q_s = B_s = -\frac{I}{R_s},$$

$$J^z(\rho) = J^\rho(\rho)\cot(\vartheta),$$

$$J^\rho(\rho) = \frac{I}{\rho}.$$

This allows expressions for all components of the vector potentials, and therefore for magnetic field and residual eddy current, to be found. For example, the expression for the z-component of the magnetic field produced by a loop, combined from all four quadrants, is given by:

$$B_z(r) = B_z^p(r) + B_z^s(r) + B_z^{CJ}(r), \qquad (10)$$

$$B_z^p(r) =$$
$$-\frac{8\mu_o I}{\pi^2}\sum_{n=1}^{\infty}\cos((2n-1)\varphi)\int_0^\infty dk\cos(kz)(kR_p)\mathfrak{I}_{2n-1}^p(k)\{\Theta(R_p - \rho)$$
$$I_{2n-1}(k\rho)K_{2n-1}'(kR_p)\Theta(\rho - R_p)K_{2n-1}(k\rho)I_{2n-1}'(kR_p)\},$$

$$B_z^s(r) = \frac{8\mu_o I}{\pi^2}$$
$$\sum_{n=1}^{\infty}\cos((2n-1)\varphi)\int_0^\infty dk\cos(kz)(kR_s)\mathfrak{I}_{2n-1}^s(k)\{\Theta(R_s - \rho)I_{2n-1}(k\rho)$$
$$K_{2n-1}'(kR_s)\Theta(\rho - R_s)K_{2n-1}(k\rho)I_{2n-1}'(kR_s)\},$$

$$B_z^{CJ}(r) = -\frac{8\mu_o I}{\pi^2}\sum_{n=1}^{\infty}(2n-1)\cos((2n-1)\varphi)\sin((2n-1)\varphi_f)$$
$$\int_0^\infty dk\cos(kz)\int_{R_p}^{R_s}\frac{dx}{x}\cos(kZ(x))\{\Theta(\rho - x)I_{2n-1}(k\rho)K_{2n-1}(kx) +$$
$$\Theta(X - \rho)I_{2n-1}(kx)K_{2n-1}(k\rho)\}$$

where:

$$\mathfrak{I}_{2n-1}^p(k) = \int_{z_i^p}^{z_f^p} dz f_p'(z)\cos[(2n-1)f_p(z)]\cos(kz), \qquad (11)$$

$$\mathfrak{I}_{2n-1}^s(k) = \int_{z_i^s}^{z_f^s} dz f_s'(z)\cos[(2n-1)f_s(z)]\cos(kz).$$

It will be recognized that all odd modes in $\cos((2n-1)\phi)$ are present. These expressions hold for both isolated and communicating loops. For isolated coils 70, 80 that are closed on themselves, $z_i^{p,s}$, $z_f^{p,s}$ are the initial and final points of the primary (p) or shield (s) loop in the upper-half of the first quadrant. Communicating loops 72, 82 which connect with at least one coil jump 74 have $z_i^{p,s}$ as initial points on the primary (p) or shield (s) loop in the upper half of the first quadrant, and $z_f^{p,s}=L_{p,s}$. From Equation (2) the result for the z-component of the residual eddy current is:

$$f_z^{CS}(z,\varphi) = \sum_{n=1}^{\infty} f_{z,2n-1}^{CS}(z)\cos[(2n-1)\varphi], \quad (12)$$

$$f_{z,2n-1}^{CS}(z) = \frac{1}{\pi}\int_0^{\infty} F_{2n-1}^{CS}(k)\sin(kz)dz,$$

$$F_{2n-1}^{CS}(k) =$$
$$-\frac{8I}{\pi}\left(\frac{1}{R_p}R(k,R_p,R_{CS})\aleph_{2n-1}^p(k) - \frac{1}{R_s}R(k,R_s,R_{CS})\aleph_{2n-1}^s(k) + \right.$$
$$\frac{\sin[(2n-1)\varphi_f]}{kR_{CS}}\left[\frac{R_{CS}}{R_p}R(k,R_p,R_{CS})\cos(kz_f^p) - \right.$$
$$\frac{R_{CS}}{R_s}R(k,R_s,R_{CS})\cos(kz_f^s) +$$
$$\left.\left.(2n-1)^2 \int_{R_p}^{R_s} \frac{dx}{x}\cos(kZ(x))\frac{I_{2n-1}(kx)}{(kR_{CS})I'_{2n-1}(kR_{CS})}\right]\right)$$

where the following notations are introduced:

$$R(k,R,R_{CS}) = \left(\frac{R_p}{R_s}\right)^2 \frac{I'_{2n-1}(kR)}{I'_{2n-1}(kR_{CS})}, \quad (13)$$

$$\aleph_{2n-1}^{p,s}(k) = \int_{z_i^{p,s}}^{z_f^{p,s}} dz \sin[(2n-1)f_{p,s}(z)]\sin(kz).$$

The above approach can also be adapted to the design of a self-shielded axial gradient (Z-gradient) coil. In this case, it is sufficient to find the $J_\phi$ component of the current density on both the primary and the shield coils. This component does not necessarily vanish at the coil edges. In other words, the current continuity equation $\nabla \cdot J=0$ does not imply that the $J_\phi$ component of the current density should be a continuous function of z even at the edges of the coils. Therefore, the values of the current densities at the edges of the coils can be treated as free parameters during the design. Thus, $$J(r)=e_\phi J_\phi(r)$$

$$J_\phi(r)=\{f_\phi^{(p)}(z)\delta(\rho-R_p)\Theta(z+L_p)\Theta(L_p-z)+f_\phi^{(s)}(z)\delta(\rho-R_s)\Theta(z+L_s)\Theta(L_s-z)\} \quad (14)$$

where the functions $f_\phi^{p,s}(z)$ are suitably represented as a Fourier series:

$$f_\varphi^{(p)}(z) = \sum_n a_n^{(p)}\sin\left(\frac{\pi n}{2L_p}z\right), \quad f_\varphi^{(s)}(z) = \sum_n a_n^{(s)}\sin\left(\frac{\pi n}{2L_s}z\right) \quad (15)$$

with the coefficients $\alpha_n^{(p)}$, $\alpha_n^{(s)}$ being determined from extremization of the functional:

$$W = E - \sum_i (B_z^{coil}(r_i) - B_i)\lambda_i - \sum_j (B_z^{CS}(r_j) - C_j B_z^{coil}(r_j))\Lambda_j - \quad (16)$$
$$(f_z^p(L_p) - A_p)\Lambda_p - (f_z^s(L_s) + A_s)\Lambda_s$$

where: E is the total energy of the gradient coil and the cold shield; $B_z^{coil}(r_i)$ is the z-component of the coil magnetic field at a set of points $r_i$ inside the DSV where the field has predetermined values $B_i$; $B_z^{CS}(r_j)$ is the z-component of the magnetic field produced by the cold shield eddy currents at a set of points $r_j$ on the surface of the DSV; $B_z^{coil}(r_j)$ is the z-component of the coil's magnetic field at the same set of points; and $C_j$ is a set of numbers that govern the residual eddy current effect. Finally, $\lambda_i$ and $\Lambda_j$ are the corresponding Lagrange multipliers. The quantities $A_p$, $A_s$ are the desired values of the $\phi$-component of the current densities at the edges of the primary and shield coils, respectively. In Equation (16) the shielding condition on the surface of the cold shield 20, namely:

$$B_\rho(r)|_{\rho=R_{CS}}=0 \quad (17)$$

has been incorporated. This leads to a continuous residual eddy current distribution given by:

$$f_\varphi^{CS}(z) = \frac{1}{\pi}\int_0^{\infty} F_{CS}(k)\sin(kz)dz \quad (18)$$

$$F_{CS}(k) = -Sh(k,R_p,R_{CS})F_p(k) - Sh(k,R_s,R_{CS})F_s(k)$$

$$F_{p,s}(k) = \int_{-L_{ps}}^{L_{ps}} f_\varphi^{p,s}(z)\sin(kz)dz,$$

$$Sh(k,R,R_{CS}) = \frac{RI_1(kR)}{R_{CS}I_1(kR_{CS})}.$$

Optimization of the functional given in Equation (16) with respect to $\alpha_n^{(p)}$ and $\alpha_n^{(s)}$ determines a suitable solution by adjusting the values of the current densities at the edge of the primary coil and the shield coil. After a solution is found the continuous current distributions on both primary and shield coils are discretized such that each loop on the primary coil carries the same current I, and each loop on the shield coil carries opposite current. The discretized coil is tested for its performance: gradient strength at isocenter, linearity and uniformity of the gradient strength over the DSV, slew rate, and residual eddy current effect.

An exemplary transverse gradient coil design is described. The exemplary coil is designed for a magnet bore having a length of 1.2 meters and a bore radius of 0.45 meters. Design dimensions of the exemplary transverse gradient coil are as follows: $R_P$=0.34385 m, $L_P$=0.434 meters, $R_S$=0.435224 meters, $L_S$=0.555 meters. In all examples described herein the target eddy current effect was chosen to be −0.22%.

The coil is aligned such that the flare angle α shown in FIG. 3 is 36.9°. In designing the X-gradient coil the field constraints shown in Table 1 were used.

TABLE 1

| ρ-position (m) | Φ-position | z-position (m) | $B_z$ (Tesla) |
| --- | --- | --- | --- |
| 0.001 | 0.000 | 0.000 | 2.7e−5 |
| 0.180 | 0.000 | 0.000 | 4.86528530650126e−3 |
| 0.001 | 0.000 | 0.200 | 2.069587125e−5 |

The first constraint corresponds to the gradient strength of $G_x$=27 mT/m at the isocenter, the second constraint is assigned for no-rollover of the z-component of the gradient magnetic field, and the third constraint corresponds to −23% of non-uniformity of the gradient strength at z=0.2 meters. The residual eddy current effect constraints were imposed at a set of points, which are given in Table 2.

TABLE 2

| z-position (m) | ρ-position (m) |
| --- | --- |
| 0.0128 | 0.2495 |
| 0.06304 | 0.2373 |
| 0.1296 | 0.1904 |
| 0.19904 | 0.0245 |

The radius of the cold shield 20 was chosen to be $R_{CS}$=0.475 m. The coil jumps 74 between primary and shield coils 16, 18 at the ends of the gradient assembly result in a significant reduction in stored energy and a change of residual eddy current effects. A study was done of total energy vs. the current density at the edge of the primary coil (quantity $A_p$ in Equation 6) and the residual eddy current effect (quantity $C_j$, the percent measurement of the residual eddy current effect, in Equation 6).

FIG. 8A shows the plot for the energy of the system, rescaled to the gradient strength of 30 mT/m and corrected back to account for the loss of the gradient strength due to the residual eddy current effect at the isocenter of the coil, as a function of the current density at the edge of the primary coil when the residual eddy current effect is equal to an exemplary −0.22%. FIG. 8B, shows the plot for the energy of the system, rescaled to the gradient strength of 30 mT/m and corrected back to account for the loss of the gradient strength due to the residual eddy current effect at the isocenter of the coil, as a function of the eddy current effect. In FIG. 8B the current density at the edge of the primary coil is equal to an exemplary 17.0 kA/m. FIG. 8A shows that the total energy at the gradient strength of $G_x$=30 mT/m after accounting for the residual eddy current effect at the isocenter of the coil, has a minimum at a certain value of the quantity $A_p$ for a given value of the residual eddy current effect. This value is suitably adjusted such that when the current densities on the primary and shield coils 16, 18 are discretized, the numbers of turns are integers.

FIG. 9 shows the results for the continuous current distributions shown in the unfolded coil layout of FIG. 5. The continuous current distributions shown in FIG. 9 were discretized with 29 turns on the primary coil 16 and 19 turns on the shield coil 18 per quadrant with 14 coil jumps 74 per half of each quadrant. Each closed loop carries current I=398.64 A in order to produce gradient strength $G_x$=30.0 mT/m at isocenter. The current layout per half quadrant is shown in FIG. 5. Henceforth, P and S denote the whole primary coil 16 and the whole shield coil 18, respectively, which together with the coil jumps 74 provide 50 cm×40 cm imaging volume.

The discretized current was used to calculate magnetic field quality characteristics. FIG. 10 shows X-gradient field non-uniformity (taking the transverse gradient coil as producing an X-gradient; of course, the transverse gradient coil can also be suitably oriented to produce a Y-gradient or other transverse gradient), while FIG. 11 shows X-gradient field non-linearity.

FIG. 12 shows the z-component of residual eddy current produced by the X-gradient coil having the current paths shown in FIG. 5. The residual eddy current of FIG. 12 and the discretized loops shown in FIG. 5 were used to calculate a residual eddy current effect over 50 cm×40 cm volume. The comparison of this result with that obtained from the continuous currents is shown in FIG. 13. This figure shows that the discretization procedure does not introduce substantial error in terms of magnitude and its variation over the volume.

With reference to FIGS. 14 and 15, the transverse gradient coil whose layout is shown in FIG. 5 is readily adapted to provide a discretely variable field of view. In a suitable modification, fourteen isolated primary coils 70 near the eye of the primary coil fingerprint are electrically decoupled from the remainder to define an interconnected coil shown in FIG. 14 and designated as P2 herein. As shown in FIG. 15, a remainder P1 of the primary coil 16 remains electrically connected with the shield coil 18. For convenience, the original coupled primary coil 16 is designated as P herein. Hence, P=P1+P2. Similarly, the shield coil 18 is also designated by S herein.

With reference to FIG. 16, a second shield coil S2 is designed to compensate for the fourteen electrically disconnected loops comprising the primary coil P2. A radial position of the second shield coil S2 is 0.415224 m. The current layout on the second shield coil is shown in FIG. 16. The current on the second shield S2 is I=398.64A. Combination of the coil shown in FIG. 15 with the second shield coil shown in FIG. 16, where the current flows in the same direction as on the primary coil, provides a reduced DSV of 30 cm. The non-uniformity and non-linearity of the gradient strength of two modes gradient coils are shown in FIGS. 17 and 18, respectively. The main mode coil corresponding to the layout of FIG. 5 provides 50 cm×40 cm imaging volume, while the coil of FIG. 15 combined with the second shield S2 shown in FIG. 16 provides 30 cm DSV.

If a second power supply is provided, the gradient coil 16, 18 can be further modified to provide three discrete fields of view. The second shield coil S2 is replaced by an eight-turn shield coil S2' positioned at the same radial location. A base mode, which provides 50 cm×40 cm imaging volume, is generated by the gradient coil shown in FIG. 5 driven at a current I.

A second mode, which provides 30 cm DSV, is generated by the gradient coil shown in FIG. 15 driven with a current I, combined with the second shield S2 shown in FIG. 19 driven with a current I/2. Hence, two power supplies (or a current divider) are used.

A third mode is generated by the gradient coil shown in FIG. 15 operating concurrently with the inner fourteen loop coil P2 of FIG. 14. The current in the primary coil P2 is reversed relative to the current in the primary coil P1 of FIG. 15. The second shield S2 of FIG. 19 is driven with a current −I. In this third mode, all coils are driven in series, and one power supply is used. This configuration provides 26 cm DSV.

When two coils are driven in series, a slew rate of the series-combined coils is given by:

$$SR = S * \frac{V - IR}{L} \quad (19)$$

where: S is a sensitivity of the coil:

$$S = \frac{G}{I},$$

with G and I being the gradient strength and the current, respectively; V is a output voltage of the power supply; R is a resistance of the coil including the cable resistance; and L is an inductance of the coil including the cable and filters inductance.

With reference to FIG. 20, when two coils are driven in parallel, the slew rate of the combined coil can be found by considering the coupling equations between two electric circuits, given by:

$$L_1 \frac{dI_1}{dt} + R_1 I_1 + M \frac{dI_2}{dt} = V_1, \; L_2 \frac{dI_2}{dt} + R_2 I_2 + M \frac{dI_1}{dt} = V_2 \quad (20)$$

where $L_1$, $R_1$, $V_1$ and $L_2$, $R_2$, $V_2$ are the inductance, resistance, and output voltage of the first and the second circuits, respectively, and M is the mutual inductance between these two coils. Then the slew rate of the combined coil is given by:

$$SR = \frac{1}{\Delta} \{(S_1 L_2 - S_2 M)(V_1 - R_1 I_1) + (S_2 L_1 - S_1 M)(V_2 - R_2 I_2)\} \quad (21)$$

$$\Delta = L_1 L_2 - M^2$$

where $S_1$, $S_2$ is the sensitivity of the first and second coils, respectively.

Moreover, the gradient coils of FIG. 5, including the primary coils 16 and secondary or shield coils 18, which are also designated herein as P and S, respectively, are readily modified to provide a continuous field of view.

Starting with the initial coil system P+S, which provides the imaging volume with largest FoV, a variable FoV system can be achieved in the following way: (1) electrically disconnect several turns near the eye of the primary coil (this defines the coil P2, for example as shown in FIG. 14) and the remaining primary coil is P1=P−P2 (for example as shown in FIG. 15). The coil P1 includes communicating coil turns 72 that communicate with communicating coil turns 82 of the shield coil 18 by coil jumps 74 at the ends of the gradient. The positions of these interconnects are known and fixed. Optionally, the coil P1 also has some isolated turns that are only on the inner cylindrical surface 60.

A second shield S1 is designed to conform with the following conditions: (i) the number of conical jumps on this coil and their angular and axial positions match those on the primary coil P1; and (ii) shield S1 together with the primary coil P1 form a well-shielded pair. The system P1+S1 provides a reduced DSV1<DSV relative to the gradient coil 16, 18 of FIG. 5.

A second shield coil S2″ is designed for the coil P2. The second shield coil S2″ together with the coil P2 form a well shielded pair. The combination of S1 and S2″ is equivalent to the initial coil S. The original coil P is not used (it was an intermediate process operation in the design procedure). Rather, two well-shielded pairs of coils: P1+S1 and P2+S2″ are the final result of the design.

These coil sets can be used as to provide either a discretely selectable FoV as in the previous examples or a continuously variable FoV. For a discretely selectable FoV, the coil (P1+P2)+(S1+S2″) provides the initial imaging volume DSV. The coil P1+S1 provides DSV1<DSV. The coil (P1−P2)+(S1−S2″) provides DSV2<DSV1.

With reference to FIG. 21, for a continuously variable FoV, the coil sets (P1+S1) and (P2+S2″) provide a continuously variable FoV when used in conjunction with two power supplies. In this arrangement, one coil set (P1+S1) is driven by a current I from a first power supply, while the coil set (P2+S2″) is driven by the current α*I from a second power supply. The parameter α adjusts the size of the FoV.

With reference to FIG. 22, another gradient coil with a continuously variable field of view is described. In this approach, a well-shielded coil is designed in accordance with process operations described previously, including current transfer between inner and outer cylindrical surfaces corresponding to primary and shield gradient coils, respectively, across a non-planar current-sharing surface. FIG. 22 shows a suitable continuous current density for such a coil which produces a 32 cm DSV.

A correction or shim gradient coil is designed in such a way that it produces zero gradient strength at an isocenter of the coil and together with the 32 cm DSV gradient coil produces a 50 cm×40 cm DSV. By itself the correction coil is well shielded.

The correction coil is suitably designed as follows: a well-shielded gradient coil is designed, including a non-planar current-sharing surface, that provides 50 cm×40 cm imaging volume and has the same gradient strength at the isocenter as that of the 32 cm DSV coil. The value of the current density at the edge of the primary coil is the same as in the gradient coil that provides 32 cm DSV. The difference (subtraction) between the current densities (on primaries and separately shield coils) of 50 cm×40 cm and 32 cm DSV defines the correction coil. The values of the current density at the edge of the coils are adjusted in such a way that allows proper discretization. An example of the current density on the correction gradient coil is shown in FIG. 23.

The current distributions of the 32 cm DSV gradient coil are discretized to generate a current layout such as that shown in FIG. 24. Similarly, the correction or shim coil current distributions are discretized to generate a current layout such as the primary and shield shim coil current layouts shown in FIGS. 25 and 26, respectively. Variation of the amount of current in the correction gradient coil allows continuous variation of the FoV. The driving coil interconnections of FIG. 21 can be used in driving the 32 cm FOV gradient coils of FIG. 24 and the correction coils of FIGS. 25 and 26. In this approach the coils P1 and S1 correspond to the well-shielded coil set of FIG. 24 that provides the 32 cm FoV, and P2 and S2″ correspond to the well-shielded correction coil pair shown in FIGS. 25 and 26.

FIGS. 24-26 describe an arrangement in which the primary coil (FIG. 24) produces a base field of view (32 cm) that is continuously enlargeable by cooperative operation of the correction coils of FIGS. 25 and 26. Alternatively, a base coil can provide a large base field of view which is continuously reducible by cooperative operation of correction coils.

Moreover, although design of transverse X-gradient coils are described herein, those skilled in the art recognize that the design of a transverse Y-gradient coil is substantively similar to design of an X-gradient coil, differing by a rotation of the whole gradient assembly by 90°.

The gradient coil design procedures described herein are readily modified to accommodate other design aspects. For example, local forces on the gradient coil can be reduced by introducing an additional constraint that the net (thrust) force on the gradient coil be zero. This constraint incorporates information about the main magnet that the gradient coil will be used with. Reduction in the local forces on the gradient coil can reduce gradient tube deflection when the coil is operated.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A gradient coil for a magnetic resonance imaging apparatus, the gradient coil including:
    a fingerprint-patterned primary coil defining an inner cylindrical surface;
    a shield coil defining an outer cylindrical surface coaxially aligned with the inner cylindrical surface and having a larger cylindrical radius than the inner cylindrical surface; and
    a plurality of coil jumps electrically connecting the primary and shield coils, the coil jumps defining a non-planar current-sharing surface extending between an inner contour coinciding with the inner cylindrical surface and an outer contour coinciding with the outer cylindrical surface;
    the primary coil, shield coil, and coil jumps cooperatively defining a current path that passes across the current-sharing surface between the inner and outer contours a plurality of times.

2. The gradient coil as set forth in claim 1, wherein:
    the primary coil extends axially a primary coil length along the inner cylindrical surface; and
    the shield coil extends axially a shield coil length along the outer cylindrical surface;
    the shield coil length not equal to the primary coil length.

3. The gradient coil as set forth in claim 2, wherein:
    the current sharing surface corresponds to a curved surface of a frustum of a cone with a cone angle defined by a difference between radii of the inner and outer cylindrical surfaces and a difference between the primary and shield coil lengths.

4. The gradient coil as set forth in claim 1, wherein:
    the shield coil is fingerprint patterned.

5. The gradient coil as set forth in claim 1, further including:
    a shielded correction coil that cooperatively adjusts a field of view over a continuous range.

6. The gradient coil as set forth in claim 1, wherein the gradient coil is a transverse gradient coil.

7. The gradient coil as set forth in claim 1, wherein the coil jumps are selected to minimize the stored energy of the coil.

8. A magnetic resonance scanner comprising:
    a main magnet for generating a temporally constant magnetic field;
    a gradient coil as set forth in claim 1 for inducing magnetic field gradients across the temporally constant magnetic field;
    at least one RF coil disposed adjacent the gradient coil;
    an RF transmitter connected with one of the RF coils for inducing and manipulating resonance;
    an RF receiver connected with one of the RF coils for demodulating induced resonance; and
    a reconstruction processor for reconstructing the demodulated resonance into an image representation.

9. The gradient coil as set forth in claim 1, wherein the primary coil, shield coil, and plurality of coil jumps are designed by a method including:
    computing current densities on the inner and outer cylindrical surfaces using constraints including minimizing stored energy and minimizing the variation of the residual eddy current effect, the current densities being generally non-zero at the inner and outer contours;
    arranging coil turns of the primary and shield coils to approximate the computed current densities on the inner and outer cylindrical surfaces; and
    during the arranging of coil turns, arranging the plurality of coil jumps to approximate the computed non-zero current densities at the inner and outer contours.

10. The gradient coil as set forth in claim 9, wherein the design method further includes:
    simultaneously with the computing of current densities on the inner and outer cylindrical surfaces, computing current densities on a current-sharing surface, the arranging of coil jumps being further constrained to approximate the computed current densities on the current-sharing surface.

11. The gradient coil as set forth in claim 9, wherein the computing of current densities further includes:
    constraining the current densities to produce a substantially spatially constant eddy current effect produced by a current density in a cold shield that surrounds the shield coil.

12. A gradient coil comprising:
    a primary coil defining an inner cylindrical surface;
    a shield coil defining an outer cylindrical surface coaxially aligned with the inner cylindrical surface and having a larger cylindrical radius than the inner cylindrical surface; and
    a plurality of coil jumps electrically connecting the primary and shield coils, the coil jumps defining a non-planar current-sharing surface extending between an inner contour coinciding with the inner cylindrical surface and an outer contour coinciding with the outer cylindrical surface, the primary coil, shield coil, and coil jumps cooperatively defining a current path that passes across the current-sharing surface between the inner and outer contours a plurality of times, wherein the primary coil includes communicating primary coil turns that electrically connect with a coil jump and isolated primary coil turns that do not electrically connect with a coil jump.

13. The gradient coil as set forth in claim 12, wherein the shield coil includes:
    communicating shield coil turns that electrically communicate with communicating primary coil turns via connecting coil jumps.

14. The gradient coil as set forth in claim 12, wherein at least some isolated primary coil turns are interconnected to define a selectively electrically switched primary sub-coil, the gradient coil further including:
a second shield coil that is selectively energized in conjunction with switching of the primary sub-coil to define a variable field of view.

15. A gradient coil including:
a primary coil defining an inner cylindrical surface;
a shield coil defining an outer cylindrical surface coaxially aligned with the inner cylindrical surface and having a larger cylindrical radius than the inner cylindrical surface;
a plurality of coil jumps electrical connecting the primary and shield coils, the coil jumps defining a non-planar current-sharing surface extending between an inner contour coinciding with the inner cylindrical surface and an outer contour coinciding with the outer cylindrical surface, the primary coil, shield coil, and coil jumps cooperatively defining a current path that passes across the current-sharing surface between the inner and outer contours a plurality of times, the primary coil including communicating primary coil turns that electrically connect with a coil jump and isolated primary coil turns that do not electrically connect with a coil jump, wherein at least some of the isolated primary coil turns are electrically interconnected to define an isolated primary sub-coil; and
a switch having at least:
a first state in which the isolated primary sub-coil is electrically connected with the communicating primary coil turns, and
a second state in which the isolated primary sub-coil is electrically isolated from the communicating primary coil turns;
the first and second states corresponding to first and second selectable fields of view.

16. The gradient coil as set forth in claim 15, wherein the isolated primary sub-coil is deenergized in the second state.

17. The gradient coil as set forth in claim 15, wherein the isolated primary sub-coil is energized with opposite polarities in the two states.

18. The gradient coil as set forth in claim 15, wherein the gradient coil further includes:
a second shield coil that is energized in one of the two states to improve uniformity of the corresponding field of view.

19. A gradient coil for a magnetic resonance imaging apparatus, the radient coil including:
a fingerprint-patterned primary coil defining an inner cylindrical surface;
a shield coil defining an outer cylindrical surface coaxially aligned with the inner cylindrical surface and having a larger cylindrical radius than the inner cylindrical surface;
a plurality of coil jumps electrically connecting the primary and shield coils, the coil jumps defining a non-planar current-sharing surface extending between an inner contour coinciding with the inner cylindrical surface and an outer contour coinciding with the outer cylindrical surface, the primary coil, shield coil, and coil jumps cooperatively defining a current path that passes across the current-sharing surface between the inner and outer contours a plurality of times; and
a generally cylindrical cold shield coaxially aligned with the outer cylindrical surface and having a larger cylindrical radius than the outer cylindrical surface, the cold shield carrying eddy current that produces a substantially spatially constant residual eddy current effect.

20. The gradient coil as set forth in claim 19, wherein the substantially spatially constant residual eddy current effect is non-zero.

* * * * *